(12) United States Patent
Luo et al.

(10) Patent No.: US 10,402,342 B2
(45) Date of Patent: *Sep. 3, 2019

(54) RE-CONFIGURABLE NON-VOLATILE MEMORY STRUCTURES AND SYSTEMS

(71) Applicant: Aspiring Sky Co., Limited, Hong Kong (CN)

(72) Inventors: Zhijiong Luo, Hopewell Township, PA (US); Xiaoming Jin, Shanghai (CN); Shu Wang, Shanghai (CN)

(73) Assignee: Aspiring Sky Co., Limited, Hong Kong (CN)

( * ) Notice: Subject to any disclaimer, the term of this patent is extended or adjusted under 35 U.S.C. 154(b) by 0 days.

This patent is subject to a terminal disclaimer.

(21) Appl. No.: 15/787,665

(22) Filed: Oct. 18, 2017

(65) Prior Publication Data
US 2018/0113812 A1 Apr. 26, 2018

Related U.S. Application Data

(63) Continuation-in-part of application No. 15/704,011, filed on Sep. 14, 2017, and a continuation-in-part of application No. 15/704,006, filed on Sep. 14, 2017.
(Continued)

(51) Int. Cl.
*G06F 12/1009* (2016.01)
*G06F 3/06* (2006.01)
(Continued)

(52) U.S. Cl.
CPC ........ *G06F 12/1009* (2013.01); *G06F 3/0604* (2013.01); *G06F 3/0632* (2013.01);
(Continued)

(58) Field of Classification Search
CPC .. G06F 12/1009; G06F 3/0632; G06F 3/0604; G06F 3/0679; G06F 2212/202;
(Continued)

(56) References Cited

U.S. PATENT DOCUMENTS 6,525,562 B1 * 2/2003 Schultz ............ H03K 19/17728
326/39
8,861,271 B1 10/2014 Zain
(Continued)

*Primary Examiner* — Ajay Ojha
(74) *Attorney, Agent, or Firm* — Turk IP Law, LLC

(57) ABSTRACT

Technologies are described for re-configurable non-volatile memory structures and systems for FPGA, as well as, non-volatile static random access memory (nvSRAM) cells with multiple non-volatile memory (NVM) bits. Proposed structures may quickly switch/reconfigure look-up tables (LUTs) and/or reconfigure FPGA routings. Memory structures according to some embodiments may reduce the switching/reconfiguring times to one or a few clock cycles. Thus, fast or real time FPGA reconfiguration is enabled, one LUT may serve multiple functions, thereby, a fraction of current FPGAs may be used to perform multi-functions, which may substantially reduce FPGA chip areas. Structures according to embodiments may further provide simple routing for entire system by re-configuration and enhanced data security by avoiding external data transmission.

26 Claims, 22 Drawing Sheets

Related U.S. Application Data

(60) Provisional application No. 62/410,828, filed on Oct. 20, 2016.

(51) Int. Cl.
  *H03K 19/177* (2006.01)
  *G11C 16/04* (2006.01)
  *G11C 7/10* (2006.01)

(52) U.S. Cl.
  CPC ..... *G06F 3/0679* (2013.01); *H03K 19/17728* (2013.01); *G06F 2212/202* (2013.01); *G11C 7/106* (2013.01); *G11C 7/1087* (2013.01); *G11C 16/0425* (2013.01); *G11C 16/0466* (2013.01); *G11C 2207/2245* (2013.01); *G11C 2213/79* (2013.01)

(58) Field of Classification Search
  CPC ...... H03K 19/17728; G11C 2207/2245; G11C 7/106; G11C 7/1087; G11C 2213/79; G11C 16/0466; G11C 16/0425
  See application file for complete search history.

(56) References Cited

U.S. PATENT DOCUMENTS

| | | |
|---|---|---|
| 9,318,196 B1 | 4/2016 | Kasai |
| 9,349,440 B1 | 5/2016 | Ma |
| 9,473,204 B2 | 10/2016 | Lin et al. |
| 9,640,256 B1 | 5/2017 | Roy |
| 2003/0001615 A1* | 1/2003 | Sueyoshi ......... H03K 19/17728 326/41 |
| 2007/0297396 A1 | 12/2007 | Eldar |
| 2008/0195803 A1 | 8/2008 | Park et al. |
| 2011/0087841 A1 | 4/2011 | Toh et al. |
| 2013/0207170 A1* | 8/2013 | Kurokawa ....... H03K 19/17728 257/296 |
| 2014/0085978 A1 | 3/2014 | Lee |
| 2014/0368235 A1* | 12/2014 | Aoki .............. H03K 19/018585 326/38 |
| 2015/0348621 A1 | 12/2015 | Sako |
| 2016/0078938 A1 | 3/2016 | Hsu |
| 2016/0098811 A1 | 4/2016 | Lu |
| 2016/0173103 A1* | 6/2016 | Gao ................. H03K 19/1776 326/39 |

* cited by examiner

RE-CONFIGURABLE NON-VOLATILE MEMORY STRUCTURES AND SYSTEMS

CROSS REFERENCE TO RELATED APPLICATIONS

This application claims the benefit of U.S. Provisional Patent Application Ser. No. 62/410,828 filed on Oct. 20, 2016. This application is also a Continuation-in-part (CIP) of U.S. patent application Ser. No. 15/704,006 filed on Sep. 14, 2017 and U.S. patent application Ser. No. 15/794,011 filed on Sep. 14, 2017. The disclosures of the above-referenced applications are hereby incorporated by reference for all purposes.

BACKGROUND

Unless otherwise indicated herein, the materials described in this section are not prior art to the claims in this application and are not admitted to be prior art by inclusion in this section.

Due to rapid marketability and high flexibility, Field Programmable Gate Arrays (FPGAs) are used more or more in the integrated circuit (IC) industry. However, the relatively slow configuration process for FPGAs prevents switching/reconfiguring between multiple functions semi-real time, which results in use of large circuit areas to perform multiple functions.

SUMMARY

Briefly stated, technologies are generally described herein for re-configurable non-volatile memory structures and systems for FPGA, as well as, nvSRAM cells with multi-NVM bits.

In some embodiments, structures are provided, which can quickly switch/reconfigure look-up tables (LUTs) and/or reconfigure FPGA routings. In a conventional FPGA, the switching/reconfiguring may usually take hundreds of clock cycles or more, depending on the chip size. Memory structures according to some embodiments may reduce the switching/reconfiguring times to one or a few clock cycles. Thus, fast or real time FPGA reconfiguration is enabled, one LUT may serve multiple functions, thereby, a fraction of current FPGAs may be used to perform multi-functions, which may substantially reduce FPGA chip areas. Structures according to embodiments may further provide simple routing and routing reconfiguration for entire system by re-configuration and enhanced data security by avoiding external data transmission.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

Figure 1:
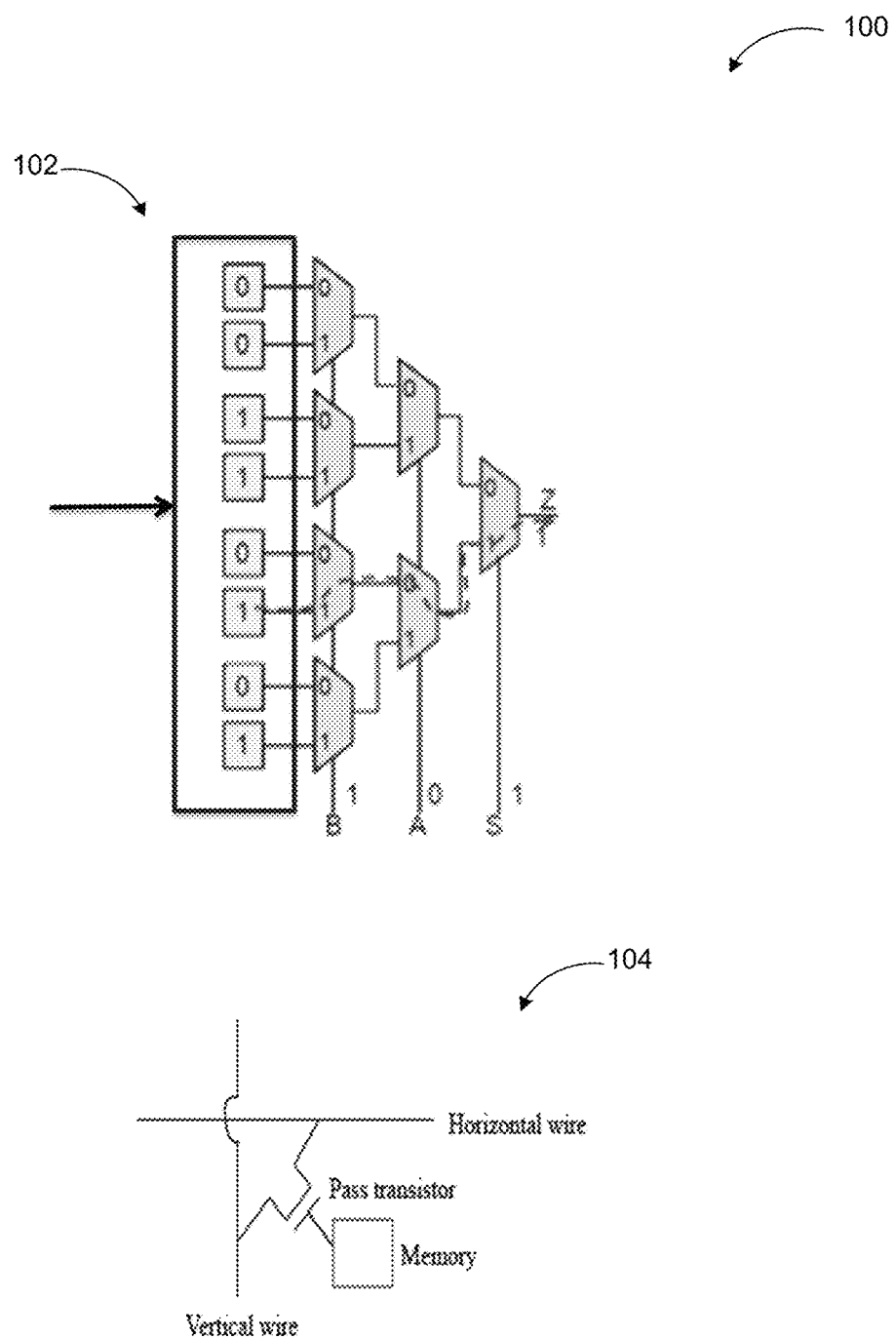
FIG. 1 is a schematic circuit diagram illustrating an example FPGA look-up table and a routing circuit for an FPGA.

all arranged according to at least some embodiments presented herein.

DETAILED DESCRIPTION

In the following detailed description, reference is made to the accompanying drawings, which form a part hereof, in the drawings, similar symbols typically identify similar components, unless context dictates otherwise. The illustrative embodiments described in the detailed description and drawings are not meant to be limiting. Other embodiments may be utilized, and other changes may be made, without departing from the spirit or scope of the subject matter presented herein. The aspects of the present disclosure, as generally described herein, and illustrated in the figures, can be arranged, substituted, combined, separated, and designed in a wide variety of different configurations, all of which are explicitly contemplated herein.

This disclosure is generally drawn, inter alia, to technologies for re-configurable non-volatile memory structures and systems for FPGA, as well as, non-volatile static random access memory (nvSRAM) cells with multiple non-volatile memory (NVM) bits. Proposed structures may quickly switch/reconfigure look-up tables (LUTs) and/or reconfigure FPGA routings. Thus, memory structures according to some embodiments may load multiple truth tables into the LUT and routing structures, by switching/loading different truth tables into the LUT for execution in one or a few clock cycles, thereby reducing the switching/reconfiguring times to one or a few clock cycles. Consequently, fast or real time FPGA reconfiguration is enabled, one LUT may serve multiple functions, thereby, a fraction of current FPGAs may be used to perform multi-functions, which may substantially reduce FPGA chip areas. Structures according to embodiments may further provide simple and fast reconfigurable routing for entire system by re-configuration and enhanced data security by avoiding external data transmission.

As used herein, NVM memory may include, but is not limited to, a floating gate memory, a SONOS memory, a PRAM (resistive RAM), phase change memories, or magnetic base memories, such as MRAM, and STTRAM, or a Ferroelectric based RAM.

FIG. 1 is a schematic circuit diagram illustrating an example FPGA look-up table and a routing circuit for an FPGA, arranged in accordance with at least some embodiments described herein.

In FIG. 1, the diagram 100 includes a conventional FPGA LUT 102, where the truth table is stored in 1×N bit SRAM or Flash memory array, as shown in the figure. For example, the LUT 102 may be a 3-input LUT with an 8-bit truth table and a 1×8 memory array. At any given time, only one set of truth table may be stored in the LUT, and it may take a long time to reload by using memory chips outside the LUT. In a memory structure according to embodiments, for an N-bit truth table, the 1×N memory array may be replaced by a M×N memory array, so up to M sets of truth tables can be loaded into the LUT simultaneously. During execution, one truth table may be chosen from the up to M truth tables internally in real time, which may normally be accomplished in one or a few clock cycles. Therefore, the structure may substantially reduce reconfiguring time. Thus, a LUT according to embodiments may be quickly reconfigured to perform up to M functions.

In conventional FPGA routing, as shown in schematic 104, the routing is controlled by a memory block. Similar to the LUTs, the memory is loaded by an outside memory block through SPI or another interface protocol. In a memory structure according to embodiments, for the routing, multi-bit memory structures may be used, which is similar to the one used in the LUTs. Thus, memory control routing may be reloaded from the internal memory, which can substantially reduce reconfiguring time, and the routing may be quickly reconfigured to perform up to M functions.

Various types of transistors may be used in embodiments. The disclosure may use, for purposes of illustration, metal-oxide semiconductor field effect transistors (MOSFET). A MOSFET may have a source terminal (e.g., a first terminal), a drain terminal (e.g., a second terminal), and a control terminal. When an appropriate level of bias signal is applied to the control terminal, the transistor may be activated (e.g., biased into active operation) wherein conduction between the source terminal and the drain terminal may be facilitated. Depending on the type of transistor (e.g., N-type or P-type), an appropriate level of bias signal may be applied, or previously applied bias signal may be removed, to cause the transistor to be deactivated wherein conduction between the source and the drain may be abated. A MOSFET "terminal" may also be termed a "port."

Figure 2A:
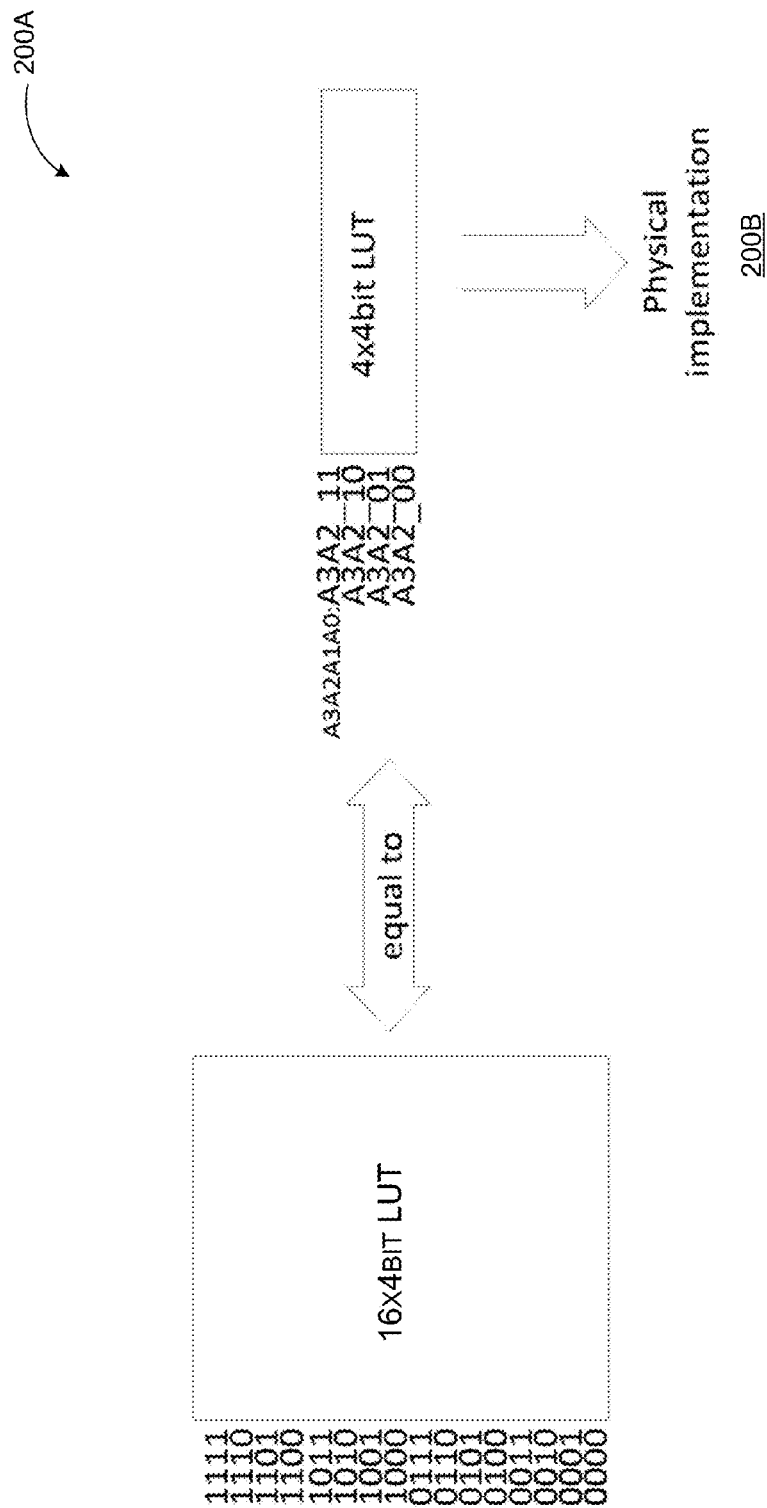
FIGS. 2A and 2B illustrate an example block diagram and a schematic diagram of a re-configurable FPGA with a re-configurable look-up table.
Figure 2B:
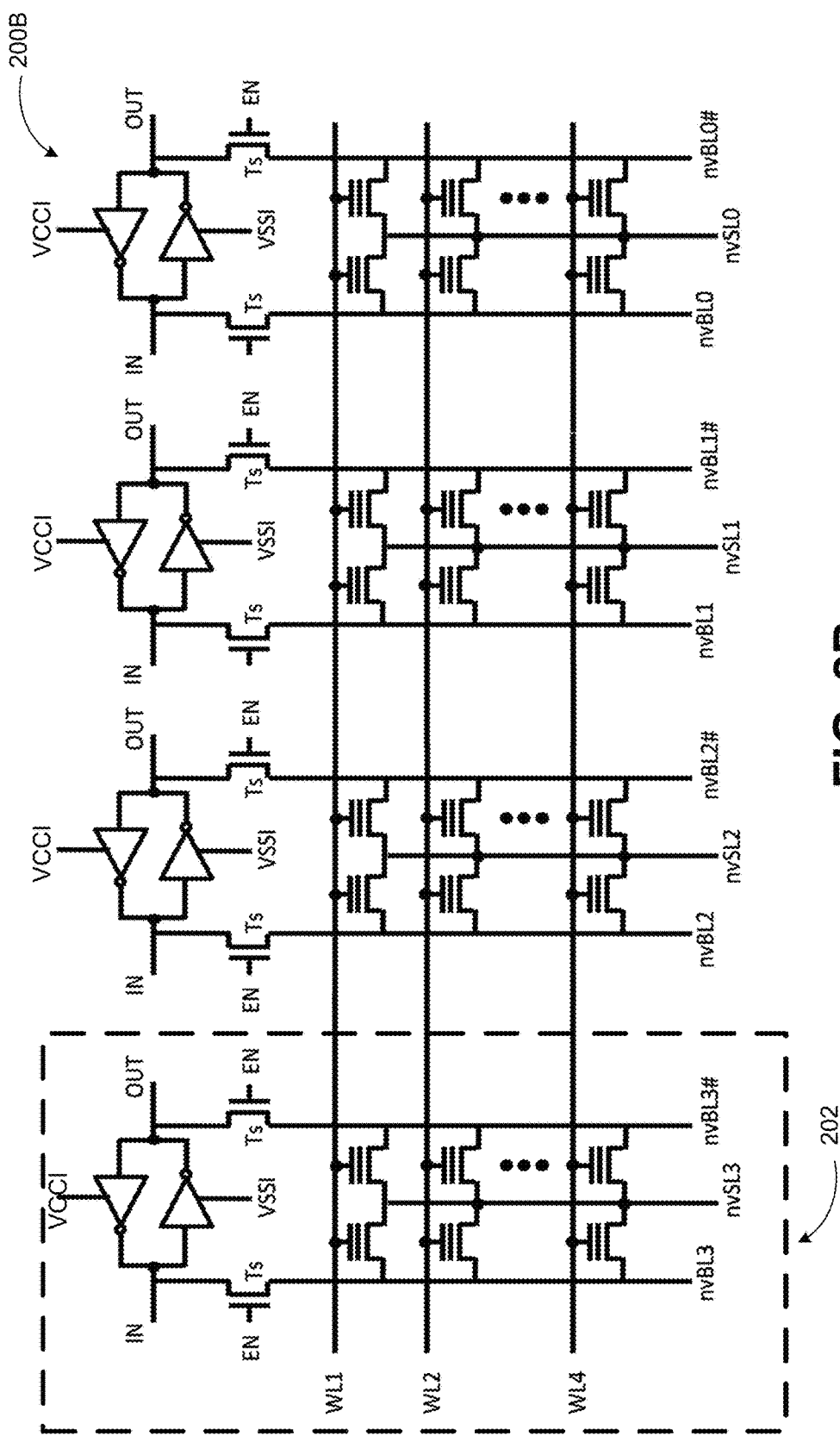

FIGS. 2A and 2B illustrate an example block diagram and a schematic diagram of a re-configurable FPGA with a re-configurable look-up table, arranged in accordance with at least some embodiments described herein.

As shown in diagram 200A, a re-configurable LUT with a multi-context configure unit may switch the context and re-configure the LUT logic to save FPGA circuit area. In diagram 200A, the left block is a traditional FPGA, and the right block represents a re-configurable FPGA according to embodiments. Diagram 200B shows the schematic circuits an example physical implementation of the LUT with repeated configure units (202). The multi-context stored in the configure unit 202 may be a different logic for multiple functions or different branches of a function. The configure data may switch from NVM to SRAM in parallel substantially reducing a total re-configure time. A static re-configurable FPGA may switch the logic in a fixed order, such as [WL1→WL2→WL3→WL4→WL1 ... ]. Furthermore, in the example embodiment, WL1: A3A2=2'b00, WL1: A3A2=2'b01, WL1: A3A2=2'b10, and WL1: A3A2=2'b11. An internal control logic may control the address sequence to keep the switch in order.

Figure 2C:
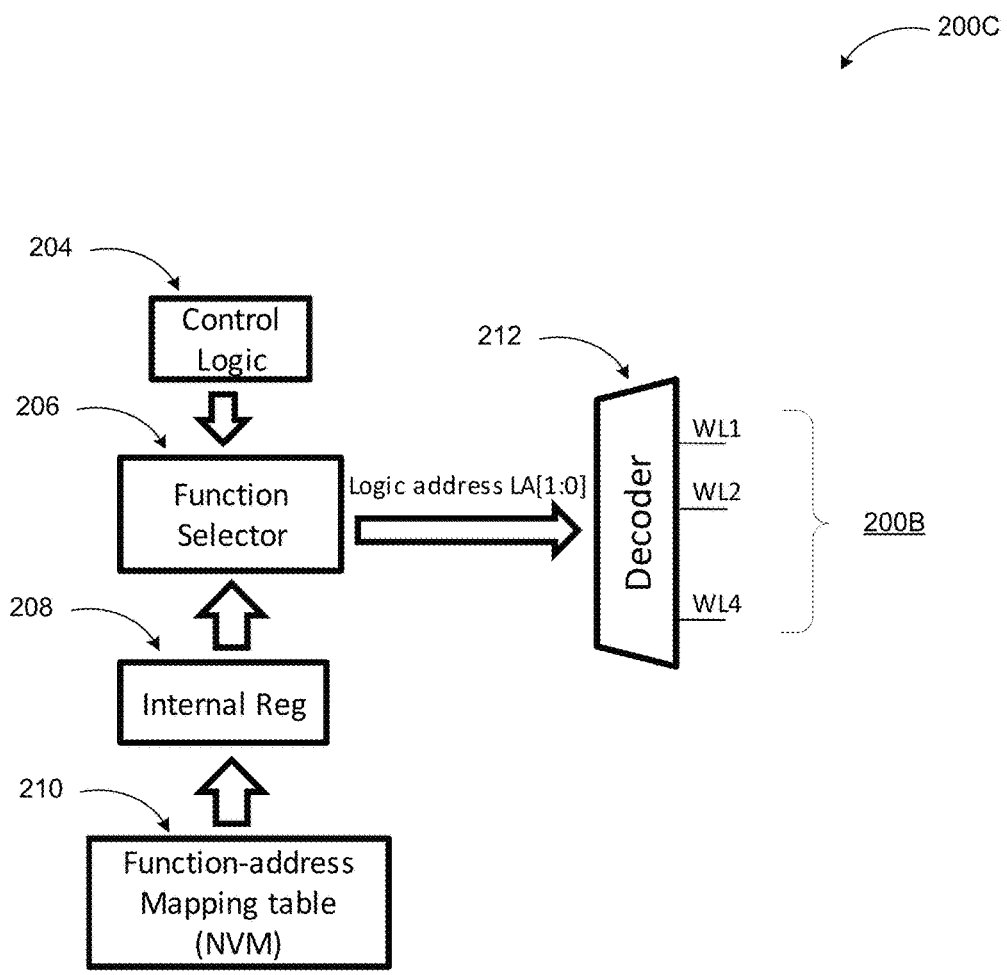
FIG. 2C is a block diagram illustrating re-configuration circuit realization for a re-configurable look-up table.

FIG. 2C is a block diagram illustrating a re-configuration circuit for a re-configurable look-up table, arranged in accordance with at least some embodiments described herein.

A dynamic re-configurable FPGA may switch the logic by functions, controlled by a control logic 204 as shown in diagram 200C. The mapping table 210 for functions and internal logic address may be saved in the NVM (Non-Volatile Memory). The mapping table 210 for functions and internal logic address may be loaded into the internal register 208 when system is turned on. The function selector 206 may generate the logic address LA[1:0] based on the mapping table 210 to switch the context in the configure unit 202 (through decoder 212). Thus, the logic of the FPGA can be switched to support the multiple functions.

Figure 3:
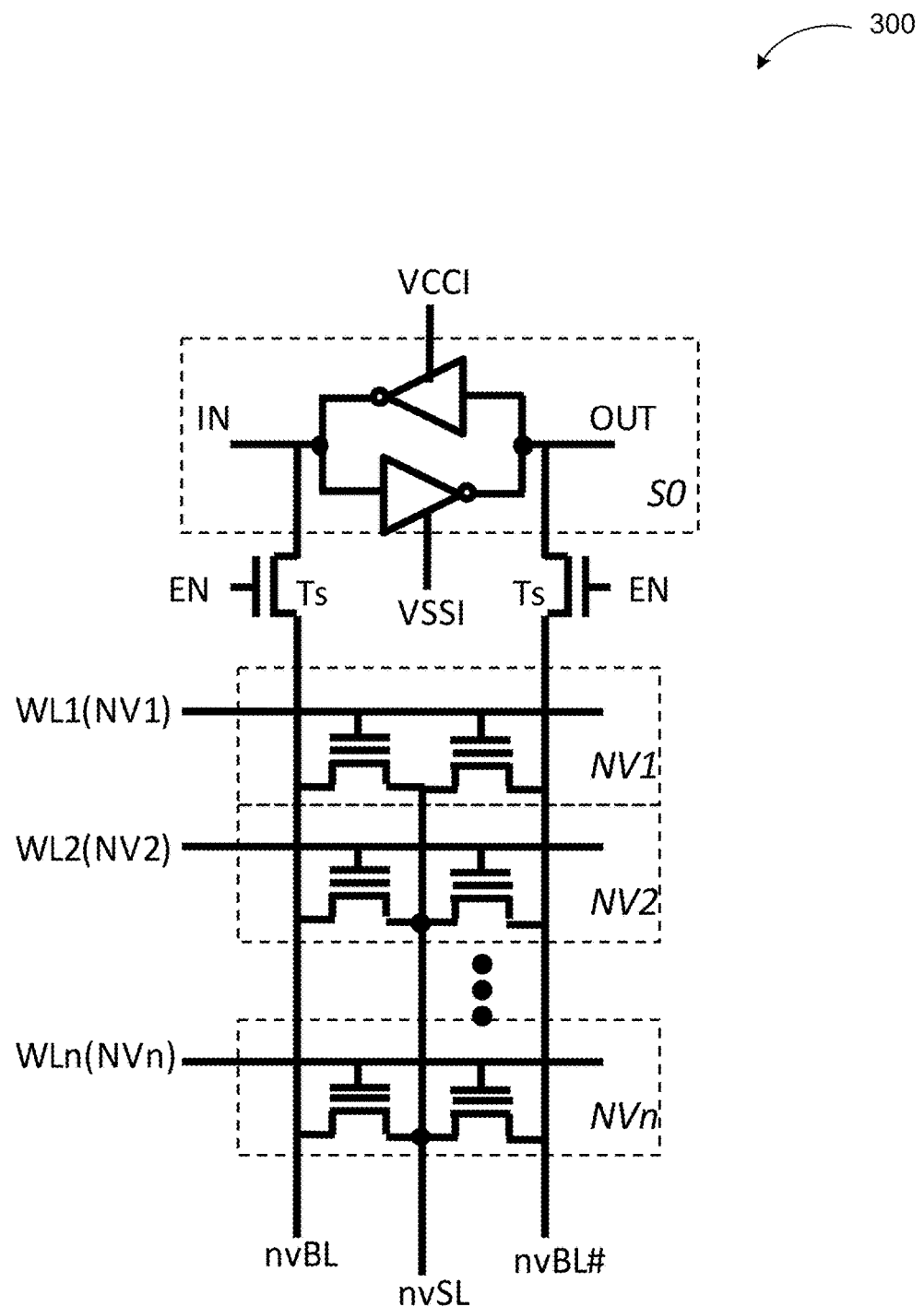
FIG. 3 is a schematic circuit diagram illustrating a multi-context nvSRAM with differential pairs of NVM cell used as a configure unit of a look-up table.

FIG. 3 is a schematic circuit diagram illustrating a multi-context nvSRAM with differential pairs of NVM cell used as a configure unit of a look-up table, arranged in accordance with at least some embodiments described herein.

An example configure unit is shown in diagram 300 as an nvSRAM with multiple NVM bits, and n groups of configure bits in the nvSRAM. S0 is the SRAM unit, and NV1~NVn is the NVM cell which stores the multiple context. The re-configurable LUT with a multi-context nvSRAM may switch the logic functions by re-configuring the data of configure RAM in LUT. The re-configure process may include loading the corresponding NVM cell data into the SRAM. The multi-context nvSRAM data may be reloaded from NVM cell to SRAM in parallel, and the re-configure time may be substantially reduced to, for example, a few to ten Nano-seconds. Extra external or embedded Flash memory to store the configuration data may not be needed in a system according to embodiments. The configuration data may be programmed into the NVM when the FPGA powers up after user compilation. When the selected WL and nvSL are biased to positive high voltage, the corresponding cell may be programmed, and an erase operation may be executed before programming. An NVM cell in the multi-context nvSRAM according to embodiments is not limited to floating gate memories, but may also be a SONOS cell, resistive RAM, MRAM or comparable NVM cells. EN signal may be controlled when read or write are performed on the NVM cell.

Figure 4:
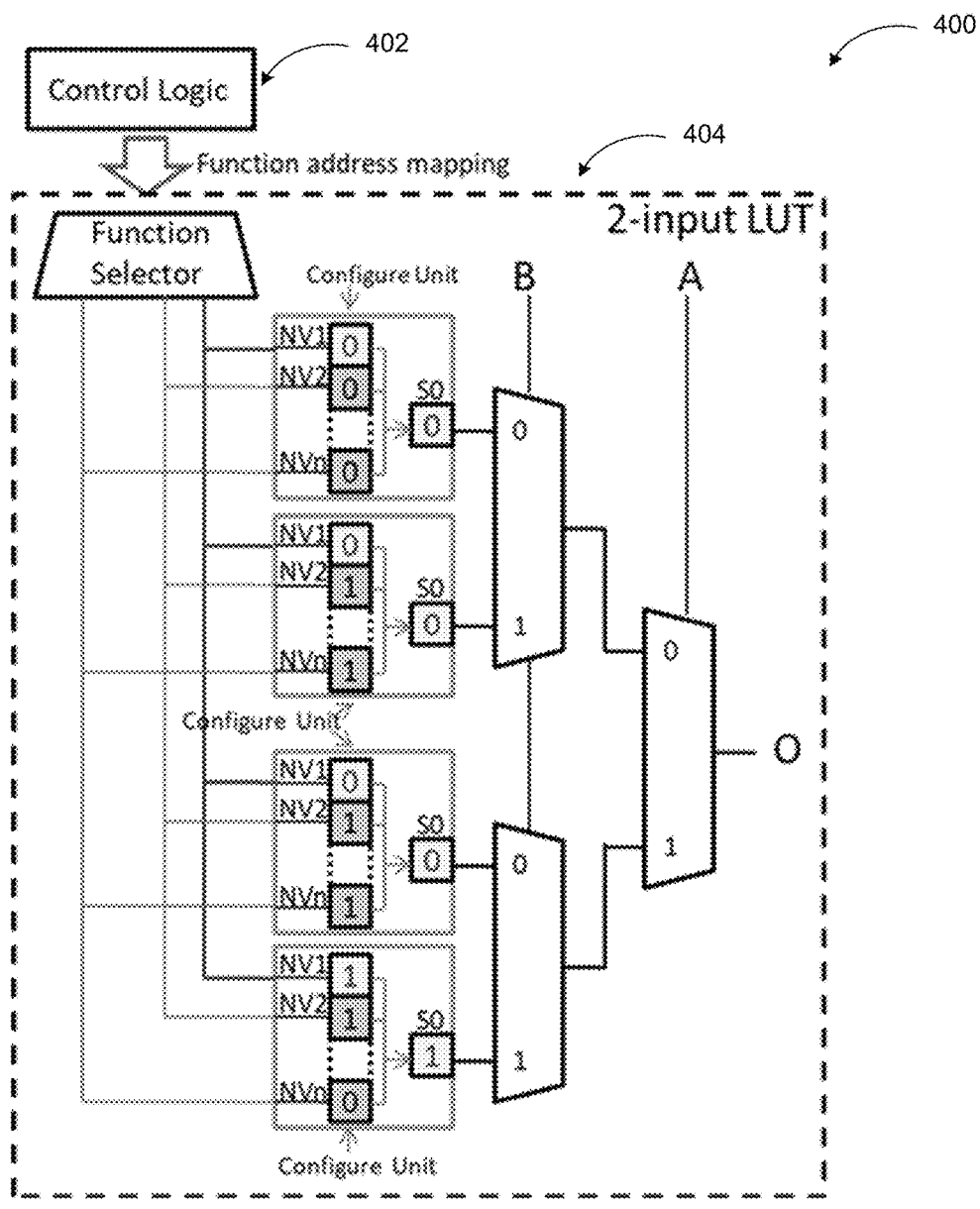
FIG. 4 is a schematic diagram illustrating an example reconfigurable 2-input look-up table and the truth table for the same.

FIG. 4 is a schematic diagram illustrating an example reconfigurable 2-input look-up table and the truth table for the same, arranged in accordance with at least some embodiments described herein.

The 2-input example LUT 404 in diagram 400 has four configure units that store the configure bits for the LUT truth table. Every configure unit may contain an SRAM S0 with multiple NVM bits NV1~NVn. The function selector may switch the configure bits in the configure RAM to re-configure the LUT logic, thus, to support the different functions. In the example LUT 404 and the example truth table 406 combination, when function selector switches to function NV1, the LUT function may be O=A&B; when the function selector switches to function NV2, the LUT function may be O=A+B; when the function selector switches to function NVn, the LUT function may be O=A(+)B. The control logic 402 may have a function-address mapping and control the internal logic address to switch the functions through function selector. In some embodiments, the function selector may be a common block for multiple LUT use.

Figure 5:
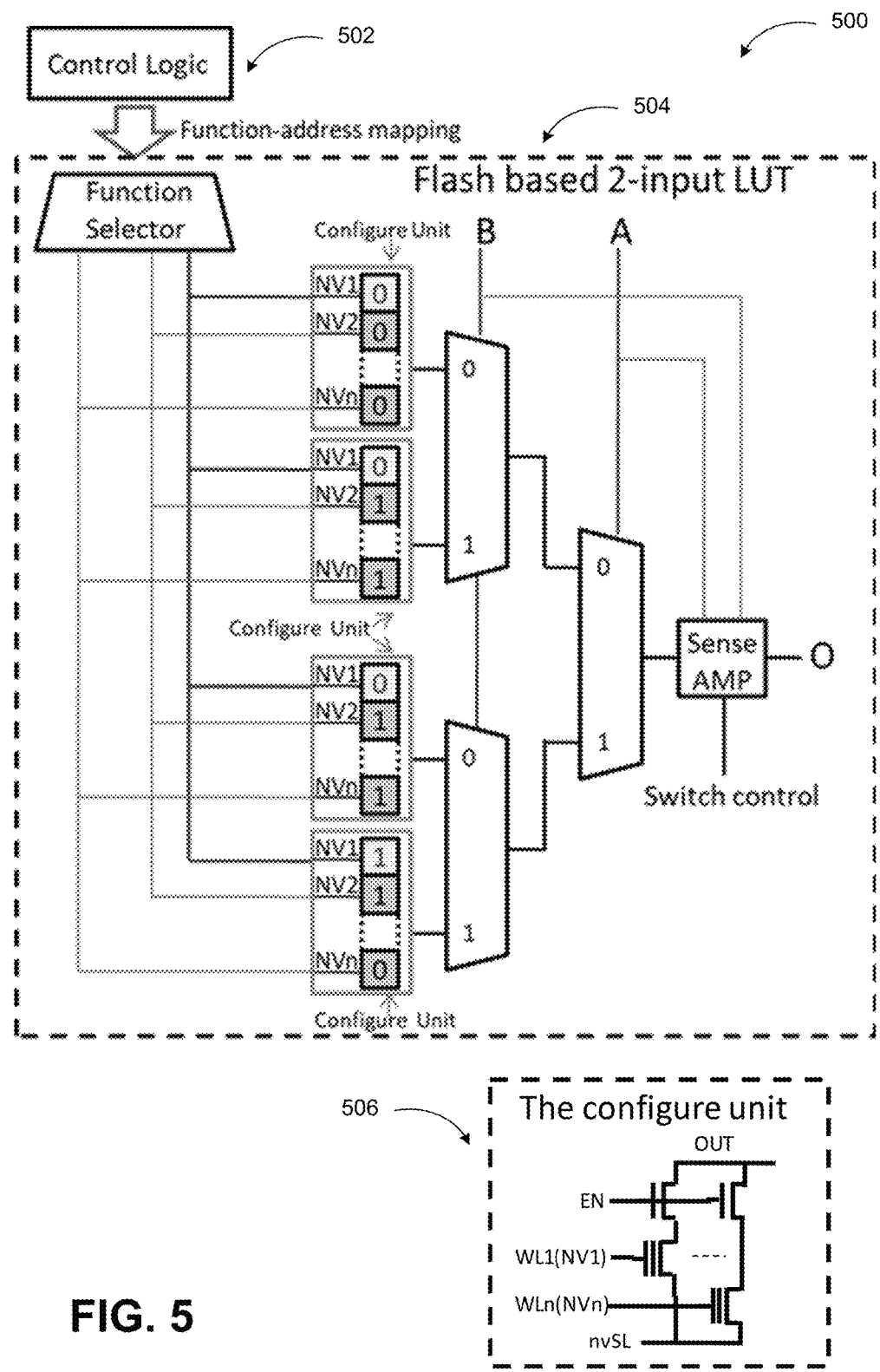
FIG. 5 is a schematic diagram illustrating an example reconfigurable 2-input look-up table with a re-configurable unit in a Flash based FPGA.

FIG. 5 is a schematic diagram illustrating an example reconfigurable 2-input look-up table with a re-configurable unit in a Flash based FPGA, arranged in accordance with at least some embodiments described herein.

In the example of diagram 500, the configure unit 506 may contain multiple NVM Cells without an SRAM. A sense amplifier may be used to read the NVM data to configure the LUT 504. The configuration data can be programmed into the NVM when the FPGA powers up after user compilation. When the selected WL and nvSL are biased to positive high voltage, the corresponding cell may be programmed, and an erase operation may be executed before programming. As above, the example NVM cells are not limited to floating gate, but may also include a SONOS cell, resistive RAM, MRAM or other comparable NVM cells. The function selector is to switch the data in the configure unit to switch the different functions based on the function-address mapping received from the control logic 502.

Figure 6:
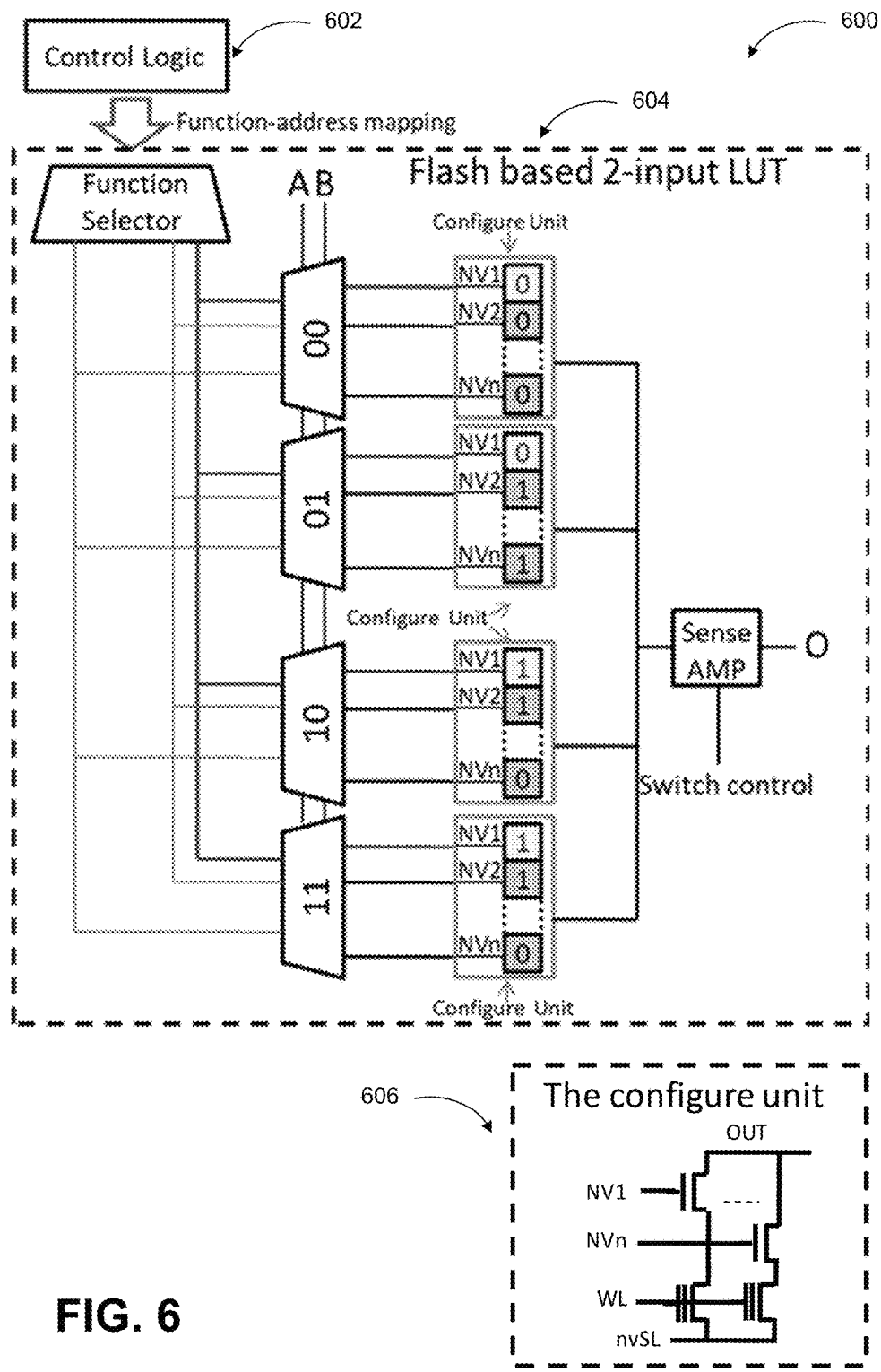
FIG. 6 is a schematic diagram illustrating another configuration of the example reconfigurable 2-input look-up table with a re-configurable unit in a Flash based FPGA of FIG. 5.

FIG. 6 is a schematic diagram illustrating another configuration of the example reconfigurable 2-input look-up table with a re-configurable unit in a Flash based FPGA of FIG. 5, arranged in accordance with at least some embodiments described herein.

In the example of diagram 600, the configure unit 606 may contain multiple NVM cells NV1~NVn to store multiple configure data and without an SRAM. The function selector is to switch and re-configure the configure unit 606 by selecting the corresponding NVM cell. A, B in the LUT 604 are used to decode which configure unit to select and read out. The switch control may detect the contest select transition and trigger the sense amplifier.

Figure 7:
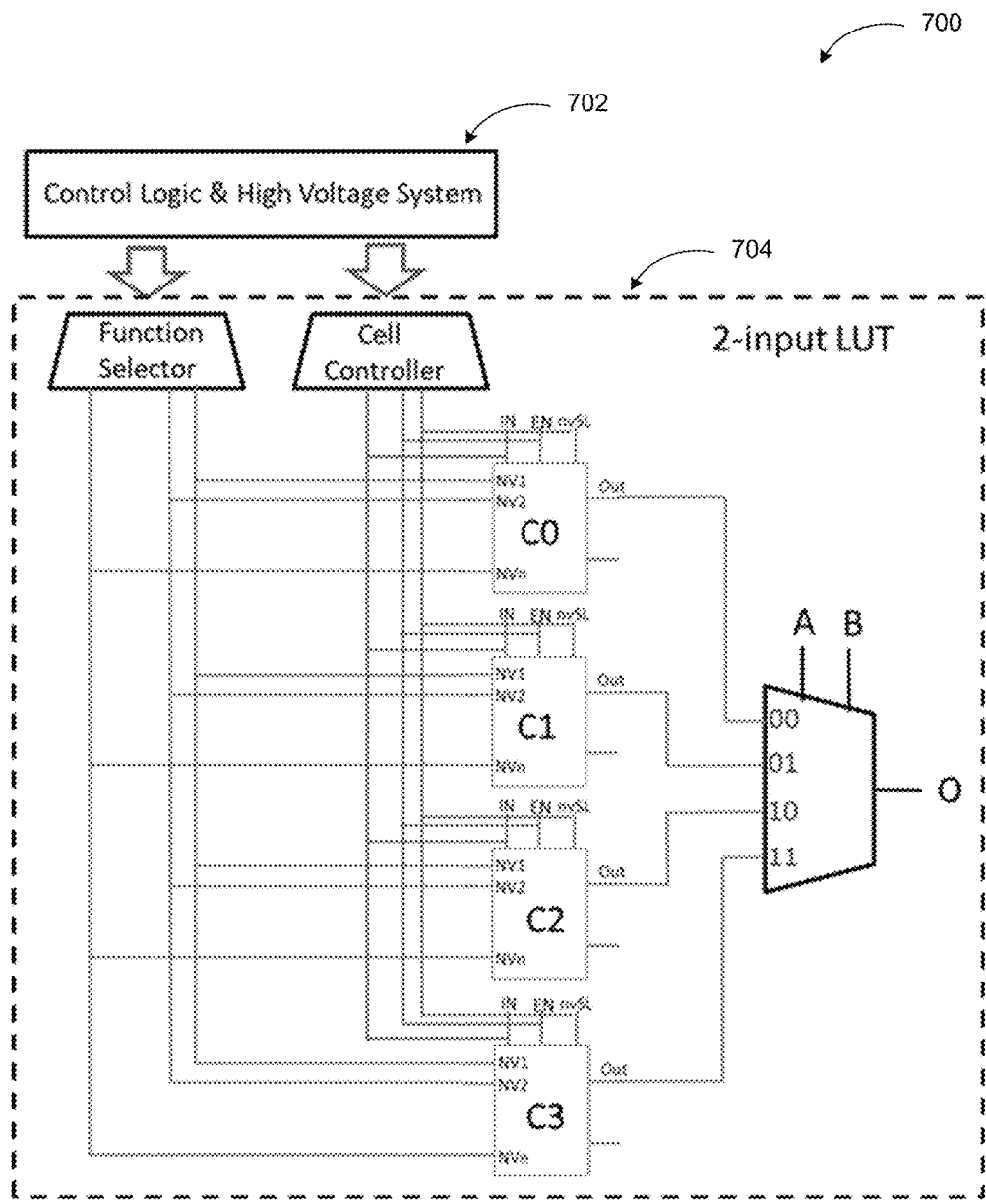
FIG. 7 is a schematic diagram illustrating an example embodiment of a re-configurable look up table.

FIG. 7 is a schematic diagram illustrating an example embodiment of a re-configurable look up table, arranged in accordance with at least some embodiments described herein.

Diagram 700 shows an example 2-input LUT 704. A, B are the input signals with O the output signal, C0~C3 are the configure unit. In the configure unit of this example configuration, there may be an SRAM with multiple NVM cells. The configure unit may also include multiple NVM cells without an SRAM. The function selector is to select the corresponding NVM cells and the cell controller is to control the NVM cell read and write. A control logic 702 may control the LUT when the configuration data is loaded and re-configured. A high voltage system combined with the control logic 702 may generate the high voltage for NVM cell read and write.

Figure 8:
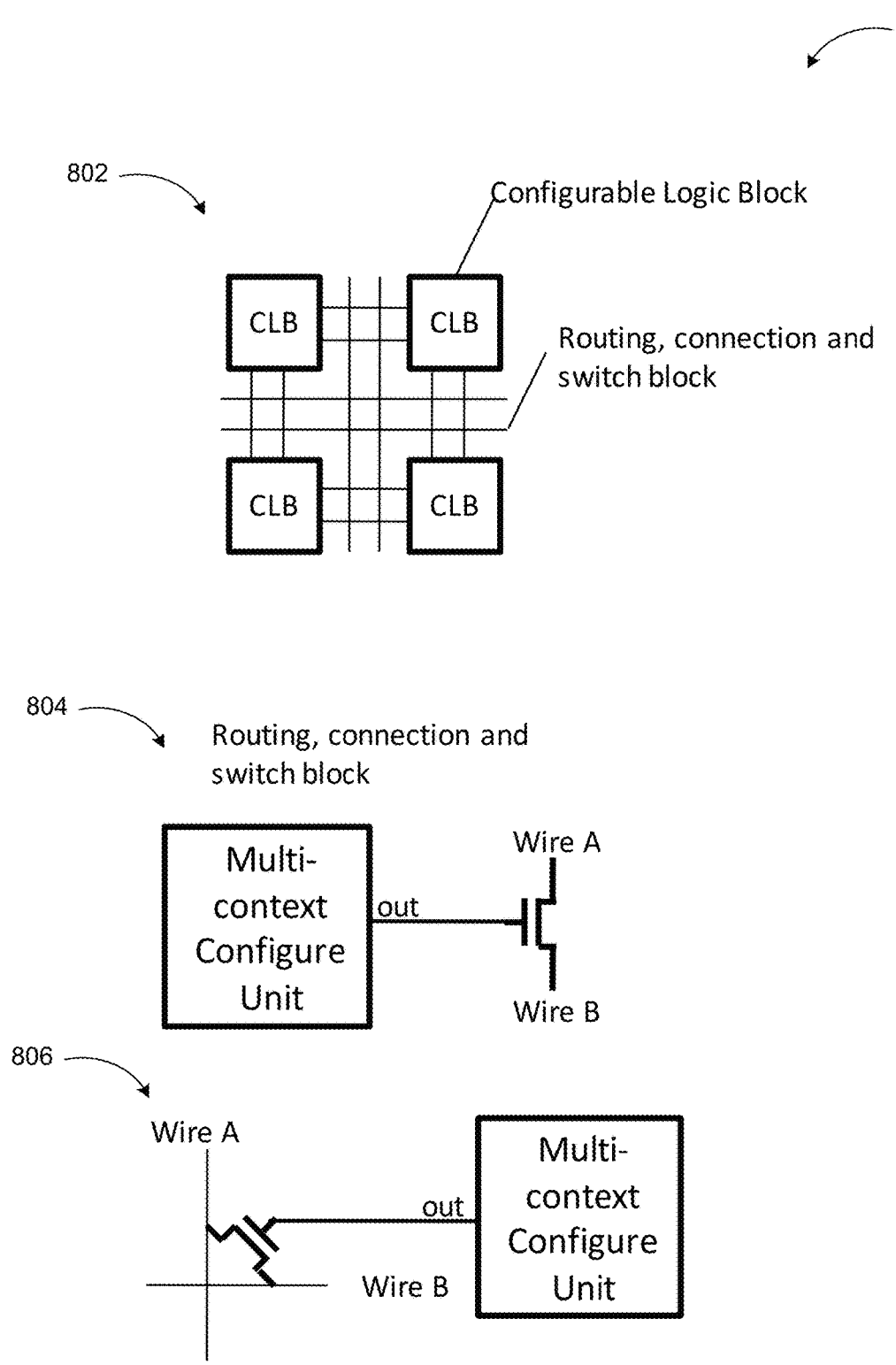
FIG. 8 illustrates example routing, connection, and switch blocks for a multi-context configure unit.

FIG. 8 illustrates example routing, connection, and switch blocks for multi-context configure unit, arranged in accordance with at least some embodiments described herein.

As shown in diagram 800, with a multi-context configure unit, the connection and switch block 802 may also be re-configured to different logic or functions. With a multi-context configure unit 804, the configure bits may be loaded from the NVM cell to the SRAM cell in parallel, and the re-configure time may be substantially reduced (e.g., to Nano-seconds). With a multi-context configure unit (806), the routing or connection information can be stored at design compile and the FPGA may bee re-configured to switch between the multiple logic functions.

Figure 9:
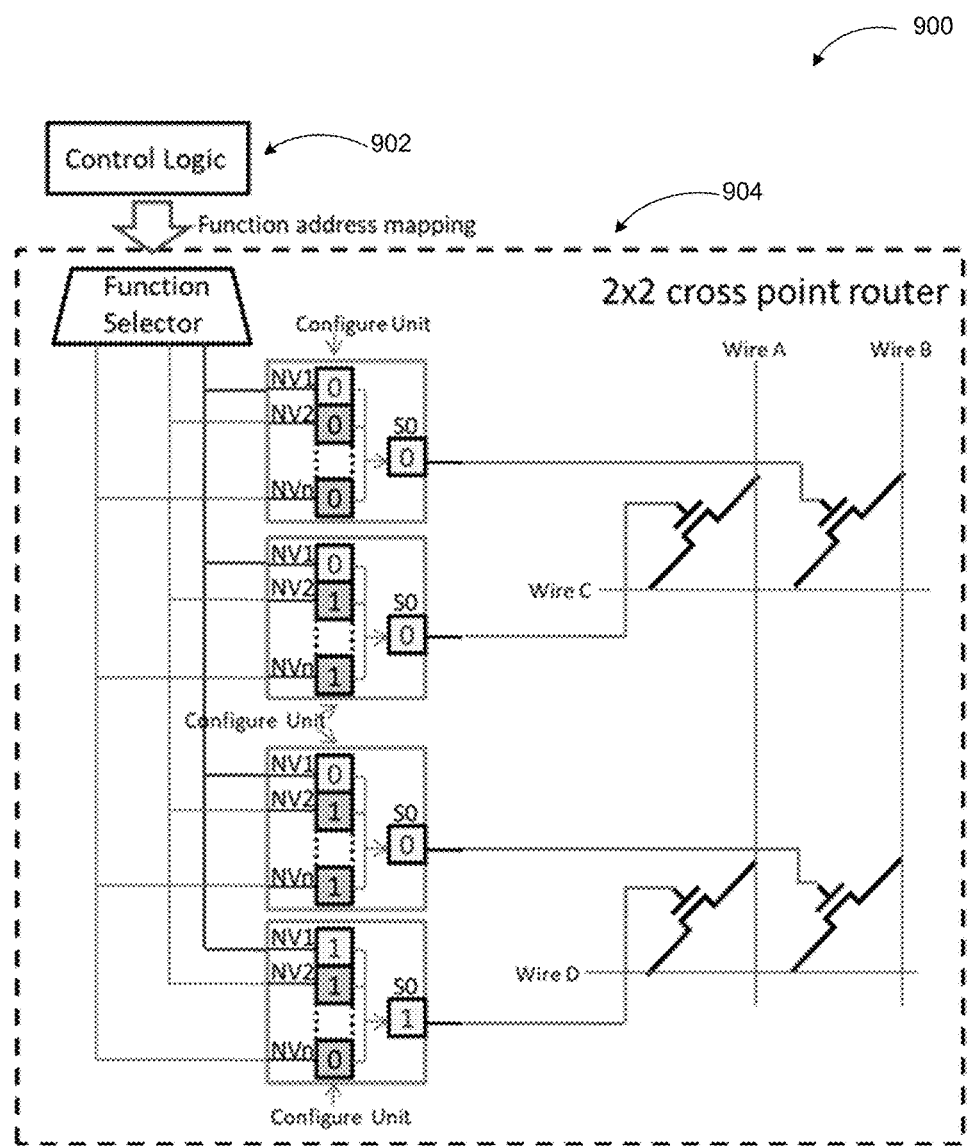
FIG. 9 is a schematic circuit diagram illustrating an example 2×2 cross point router in the re-configurable FPGA.

FIG. 9 is a schematic circuit diagram illustrating an example 2×2 cross point router in the re-configurable FPGA, arranged in accordance with at least some embodiments described herein.

Diagram 900 shows a 2-horizontal-2-vertical wire router as an example. In the configure unit of the example LUT 904, there may be an SRAM S0 with multiple NVM cells NV1~NVn. The function selector is to select the corresponding NVM cells and the cell controller is to control the NVM cell read and write. A control logic 902 may control the LUT 904 when the configuration data is loaded and re-configured. The programmable interconnect points (PIPs) are not limited to the cross-point structure in the example LUT 904, but may also be compound, break-point, etc. The configure unit may be the same structure in the LUT 904. In other embodiments, the configure unit may include multiple NVM cells without an SRAM.

Figure 10:
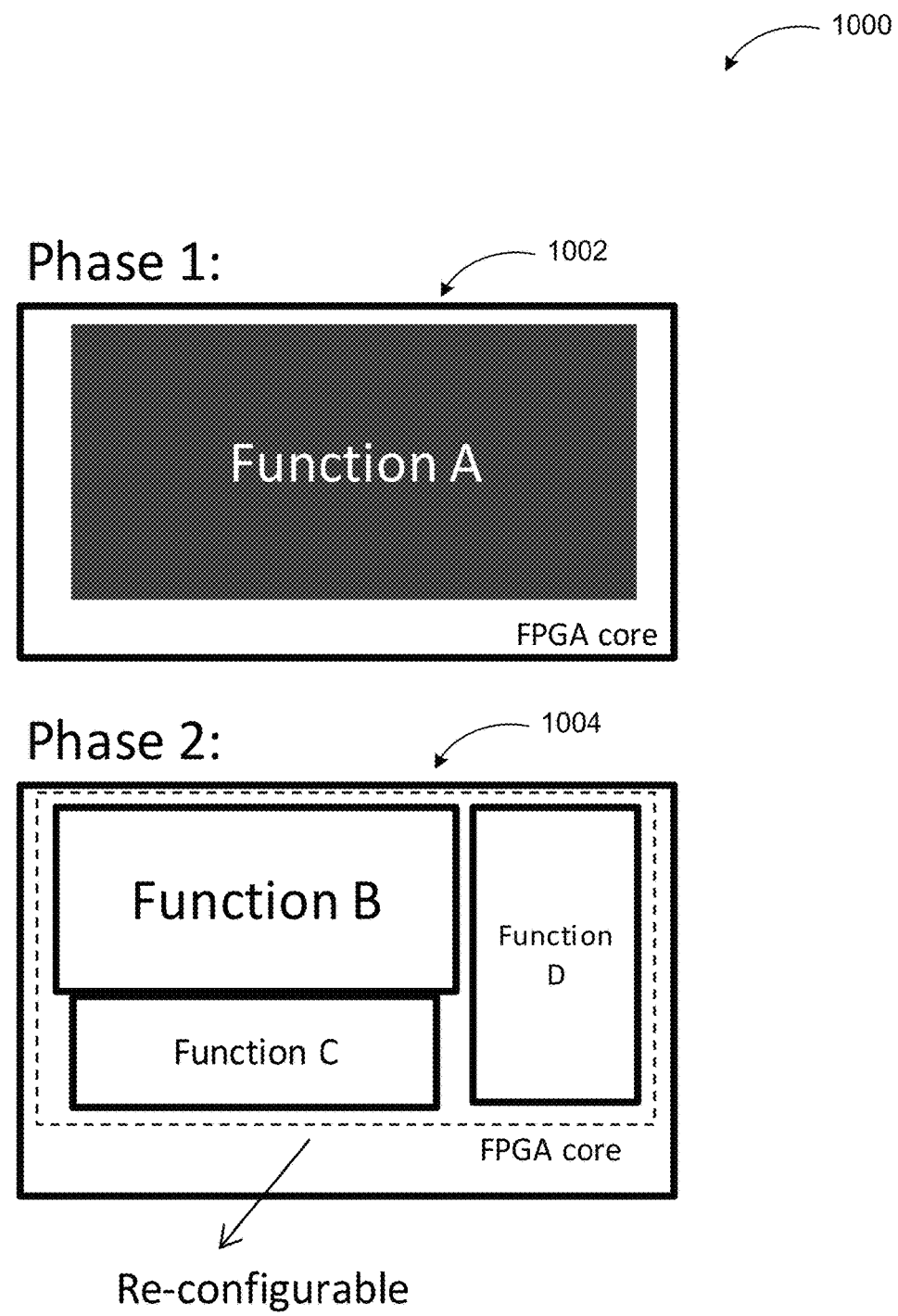
FIG. 10 illustrates an example multiple functions block in a re-configurable FPGA with multiple functions.

FIG. 10 illustrates an example multiple functions switch in a re-configurable FPGA with multiple functions, arranged in accordance with at least some embodiments described herein.

FPGA system according to examples is re-configurable with multiple functions. With no re-configuration, the FPGA may have a large gate count and need large circuit area. With re-configuration, the FPGA may need a substantial re-configure time. With the fast re-configurable structure FPGA according to embodiments, fast switch (re-configure) higher speed, smaller circuit area, less gate count, and simpler routing for the total system may be achieved. As shown in diagram 1000, the function switch may include a phase 1 (1002), when the FPGA is used for function A. In a phase 2 (1004), the FPGA may be re-configured for functions B, C, D. The re-configure process may be executed after function A as the re-configure time can be very short. The FPGA may include a control logic to control the re-configure process by using internal logic address or decoder to load the corresponding NVM data into the SRAM in the configure unit, thereby, to re-configure the FPGA.

Figure 11:
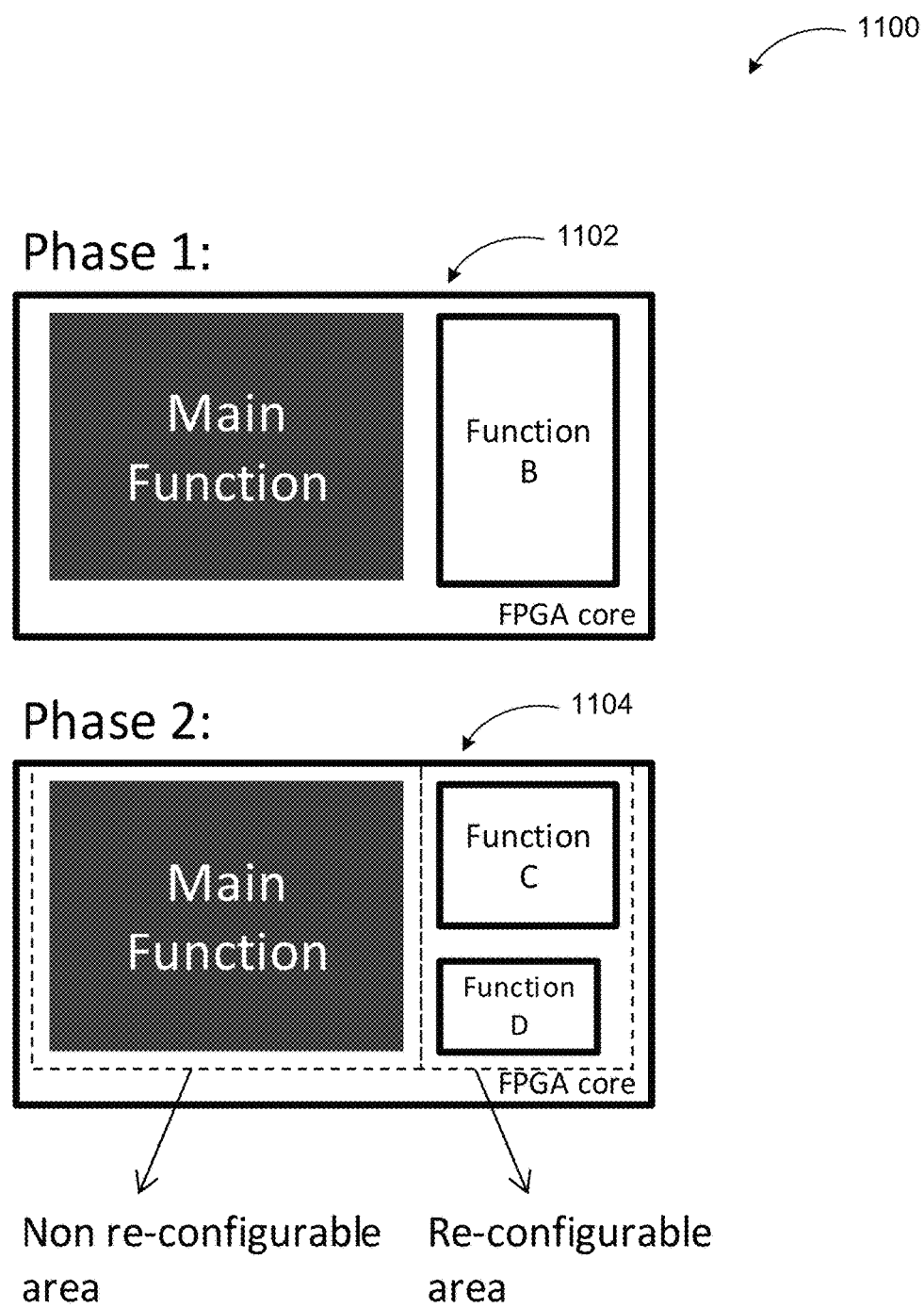
FIG. 11 illustrates another example multiple functions block in a re-configurable FPGA with multiple functions.

FIG. 11 illustrates another example multiple functions switch in a re-configurable FPGA with multiple functions, arranged in accordance with at least some embodiments described herein.

In another example scenario, shown in diagram 1100, an FPGA system may have a non-re-configurable area and a configurable area. The FPGA system may have a main function (non-re-configurable) and other functions such as functions B, C, D (re-configurable). Without re-configuration, the FPGA may have a large gate count and large circuit area. With re-configuration, the FPGA may need a substantial re-configure time. With the fast re-configurable structure FPGA according to embodiments, fast switch (re-configure) higher speed, smaller circuit area, less gate count, and simpler routing for the total system may be achieved. As shown in diagram 1100, the function switch may include a phase 1 (1102), when the FPGA is used for functions A and B. In a phase 2 (1104), the re-configurable portion of the FPGA may be re-configured for functions C, D without re-configuring the main function. The re-configure process may be executed while function A is in progress as the re-configure time can be very short. The FPGA may include a control logic to control the re-configure process by using internal logic address or decoder to load the corresponding NVM data into the SRAM in the configure unit, thereby, to re-configure the FPGA.

Figure 12:
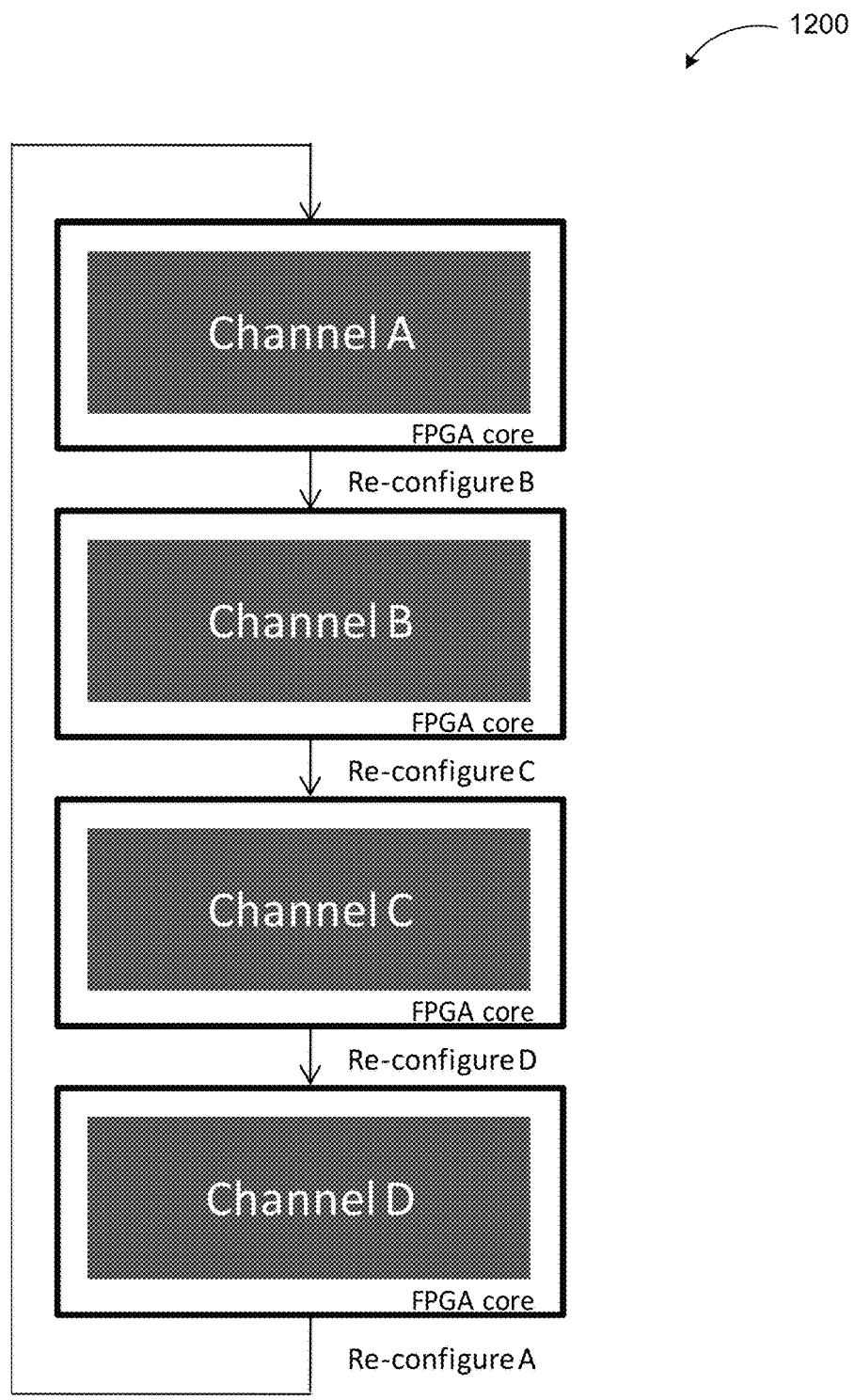
FIG. 12 illustrates an example pipeline structure for a re-configurable FPGA.

FIG. 12 illustrates an example pipeline structure for a re-configurable FPGA, arranged in accordance with at least some embodiments described herein.

A system according to embodiments may have several channels in parallel. Thus, the functions may be executed in a pipe-line structure as shown in diagram 1200 with an example channel A-B-C-D sequence. The channel sequence is not limited to A-B-C-D, and may include any order. An internal control logic may be used to control the channel sequence and re-configure the FPGA to support the different functions of the different channels. The channel order based system shown in diagram 1200 may result in smaller circuit area but may result in longer system time. Thus, the circuit area and the system time may be balanced at FPGA design. In some systems, the different channels may not need to be active at a same time, thereby reducing the total system time impact.

Figure 13:
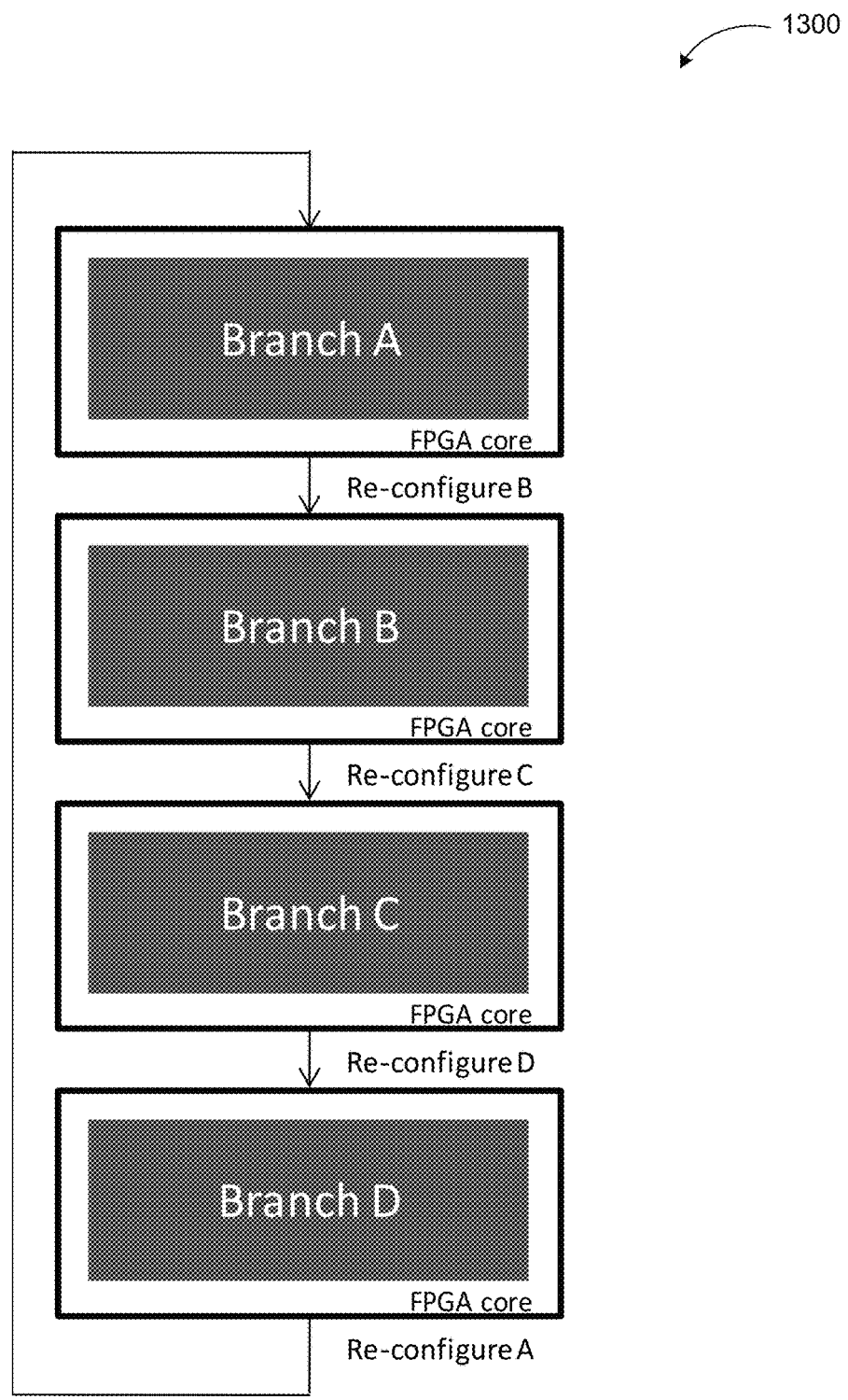
FIG. 13 illustrates another example pipeline structure for a re-configurable FPGA.

FIG. 13 illustrates another example pipeline structure for a re-configurable FPGA, arranged in accordance with at least some embodiments described herein.

In other scenarios, a main function of FPGA may be divided into branches such as A, B, C and D. As shown in diagram 1300, the functions may be executed in a pipe-line structure, with the branch A-B-C-D sequence. An internal control logic may be used to control and re-configure the FPGA to support the different functions of the different branches. The branch order based system shown in diagram 1200 may result in smaller circuit area but may result in longer system time. Thus, the circuit area and the system time may be balanced at FPGA design.

FIG. 14 through 19 illustrate various example embodiments of nvSRAM memory structures, where the NVM cells, are connected to inner nodes of the SRAM of each memory structure (that is inside two passing gate transistors of the SRAM), unlike conventional systems where the connection is typically made through bitlines (that is outside the two passing gate transistors of the SRAM). The illustrated memory structures may provide enhanced efficiency, speed, and reduced resource consumption in a wide variety of applications. One example implementation of such memory structures may be in an FPGA like the FPGA structures discussed herein. However, the memory structures of FIG. 14 through 19 are not limited to FPGA implementations and may be used in any memory employing circuitry.

Figure 14:
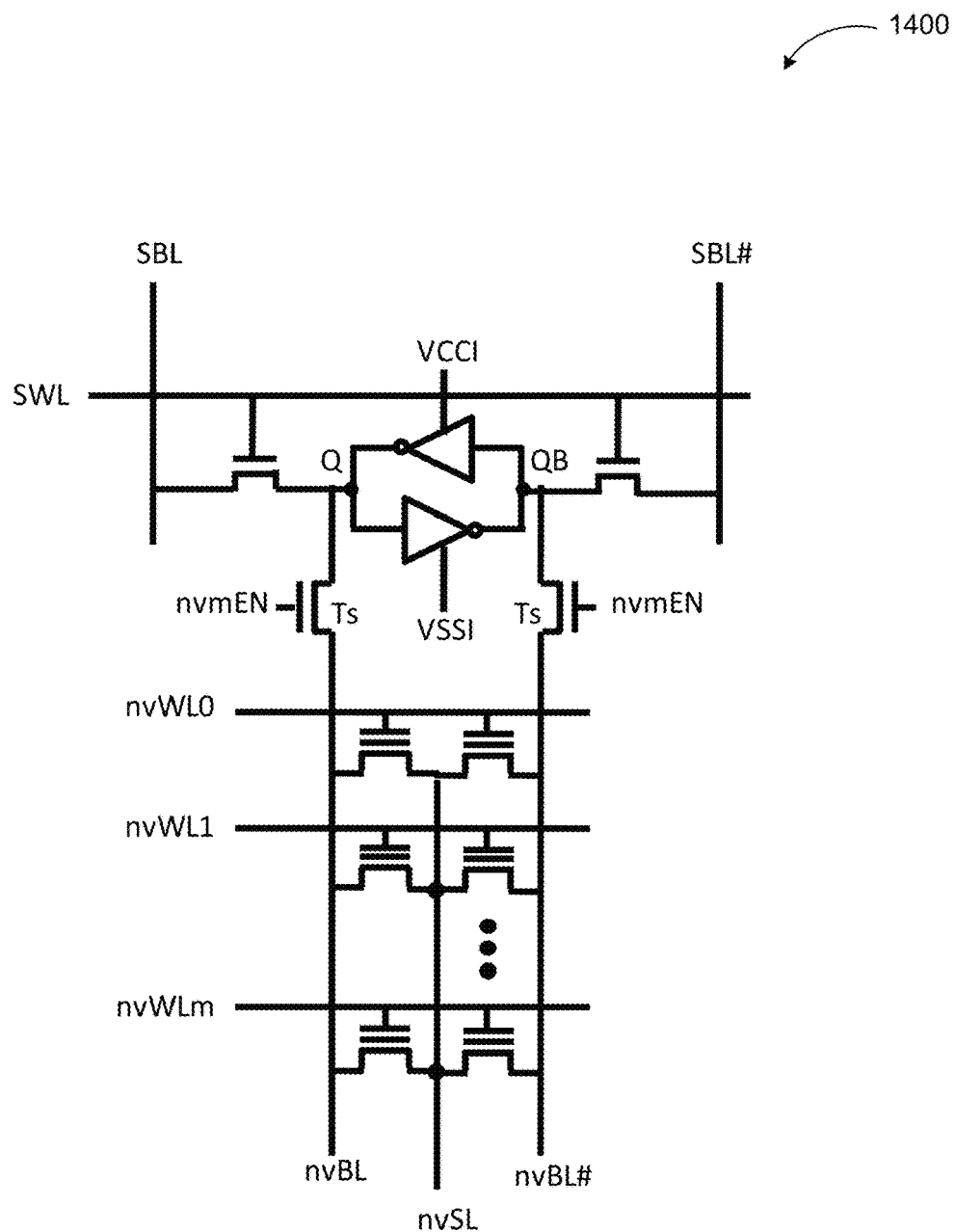
FIG. 14 is a schematic circuit diagram illustrating a differentially structured nvSRAM cell with NVM cell connected by multiple rows.

FIG. 14 is a schematic diagram illustrating a differentially structured nvSRAM cell with NVM cell connected by multiple rows, arranged in accordance with at least some embodiments described herein.

Diagram 1400 shows a differential cell structure for an nvSRAM cell with NVM cell connected by multiple rows. Differential pairs of NVM cells (e.g., floating gate) may be connected to the latch node Q/QB of the SRAM. Device Ts may be the isolation device between SRAM and NVM. In an Erase mode, Ts may be off, nvBL/nvBL#/nvSL may be floating, selected WL may be biased to a negative voltage (e.g., −10V). In some embodiments, the well of NVM cell may be biased to a positive high voltage while gate is maintained at a negative voltage.

In a Program mode, the Select gate may be biased to positive HV, nvSL may be floating. In some embodiments, nvSL may be biased at a positive voltage. nvBL/nvBL# of the program cell may be set to '0' while inhibited cell is floating. In a Recall mode, VCCI/VSSI may be turned off, Q/QB may be discharged to a ground level by turning on SWL and forcing SBL/SBL# at '0'. The selected pair of NVM cell and Ts may be turned on and nvSL may be applied to VDD level. Then, there may be a voltage difference between Q and QB due to the different Vt states of the differential cells. VCCI may be ramped up and VSSI pulled down. Q and QB may be latched to a stable status according to the Vt status of the NVM cells.

Figure 15:
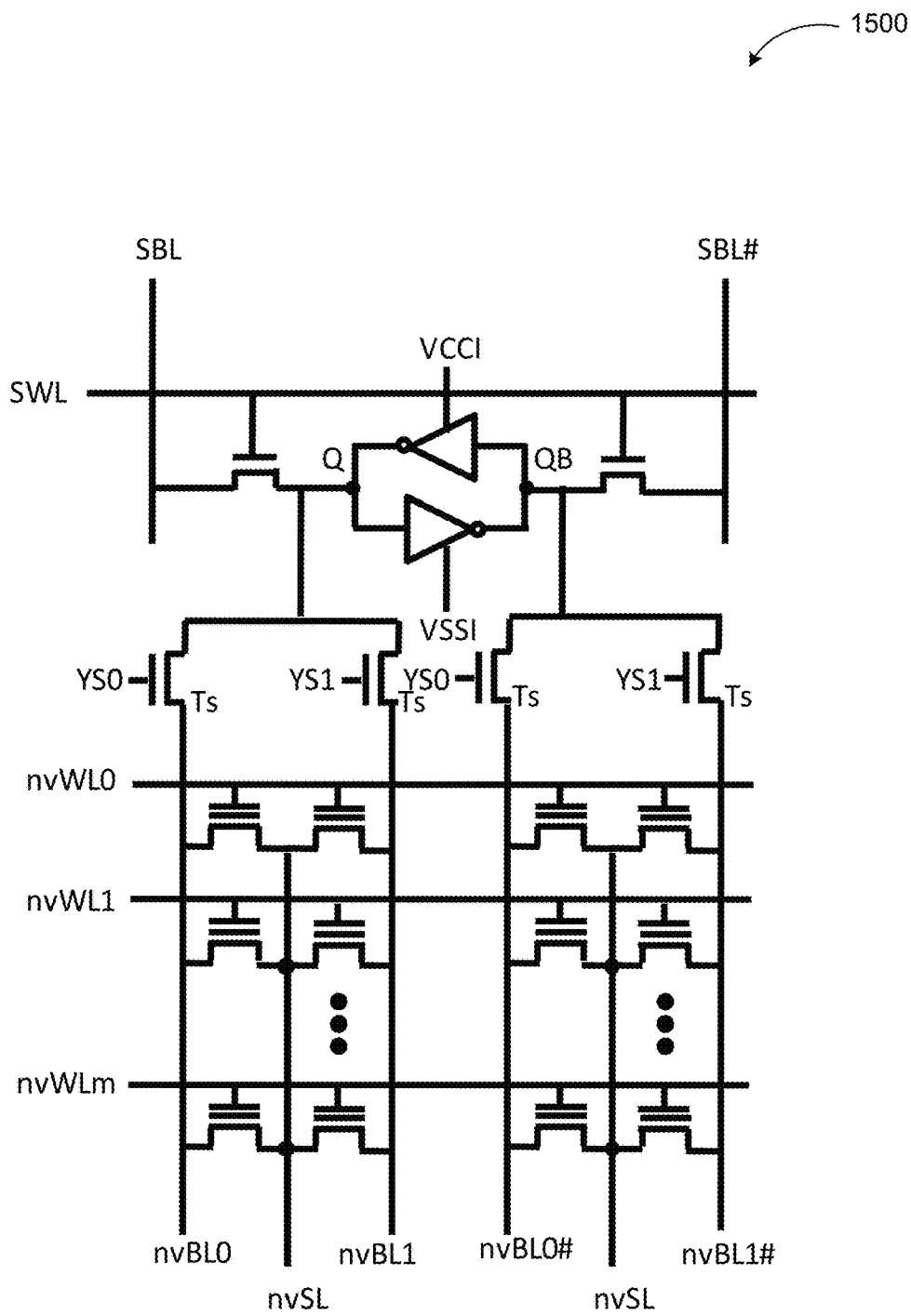
FIG. 15 is a schematic circuit diagram illustrating a differentially structured nvSRAM cell with NVM cell connected by multiple rows and columns.

FIG. 15 is a schematic diagram illustrating a differentially structured nvSRAM cell with NVM cell connected by multiple rows and columns, arranged in accordance with at least some embodiments described herein.

Diagram 1500 shows a differential cell structure for an nvSRAM cell with NVM cell connected by multiple rows and columns. Only 1 nvBL/nvBL# pair may be selected for both recall and write, and YS0/YS1 may be the column decode signal. The number of columns may not be limited to two. In an Erase mode, Ts may be off, nvBL/nvBL#/nvSL may be floating, selected WL may be biased to a negative voltage (e.g., −10V). In some embodiments, the well of NVM cell may be biased to a positive high voltage while gate is maintained at a negative voltage.

In a Program mode, the Select gate may be biased to positive HV, nvSL may be floating. In some embodiments, nvSL may be biased at a positive voltage. nvBL/nvBL# of the program cell may be set to '0' while inhibited cell is floating. In a Recall mode, VCCI/VSSI may be turned off, Q/QB may be discharged to a ground level by turning on SWL and forcing SBL/SBL# at '0'. The selected pair of NVM cell and Ts may be turned on and nvSL may be applied to VDD level. Then, there may be a voltage difference between Q and QB due to the different Vt states of the differential cells. VCCI may be ramped up and VSSI pulled down. Q and QB may be latched to a stable status according to the Vt status of the NVM cells.

Figure 16:
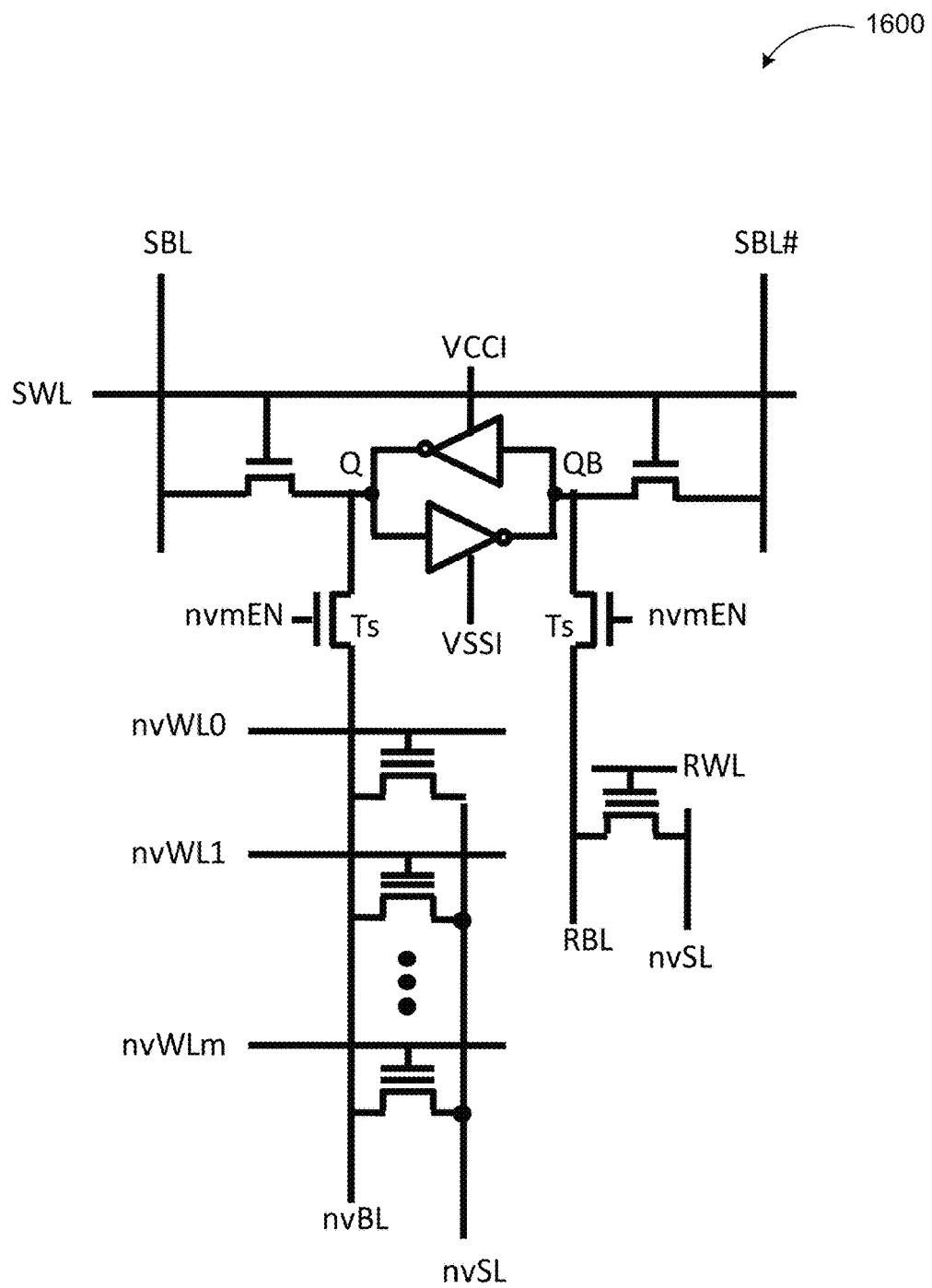
FIG. 16 is a schematic circuit diagram illustrating a single-cell structured nvSRAM cell with NVM cell connected by multiple rows.

FIG. 16 is a schematic diagram illustrating a single-cell structured nvSRAM cell with NVM cell connected by multiple rows, arranged in accordance with at least some embodiments described herein.

Diagram 1600 shows a single-cell structure for an nvSRAM cell with NVM cell connected by multiple rows. The single cell may be connected to the latch node Q of SRAM, a reference cell connected to QB, and vice versa. Device Ts may be the isolation device between SRAM and NVM. In an Erase mode, Ts may be off, nvBL/nvSL may be floating, selected WL may be biased to a negative voltage (e.g., −10V). In some embodiments, the well of NVM cell may be biased to a positive high voltage while gate is maintained at a negative voltage.

In a Program mode, the Select gate may be biased to positive HV, nvSL may be floating. In some embodiments, nvSL may be biased at a positive voltage. nvBL of the program cell may be set to '0' while inhibited cell is floating. In a Recall mode, VCCI/VSSI may be turned off, Q/QB may be discharged to a ground level by turning on SWL and forcing SBL/SBL# at '0'. The pair of selected NVM cell and the reference cell, and Ts may be turned on and nvSL may be applied to VDD level. Then, there may be a voltage difference between Q and QB due to the different Vt states of the selected NVM cell and the reference cell. VCCI may be ramped up and VSSI pulled down. Q and QB may be latched to a stable status according to the Vt status of the NVM cells. In some embodiments, RBL may include an additional capacitor circuit to match the nvBL loading.

Figure 17:
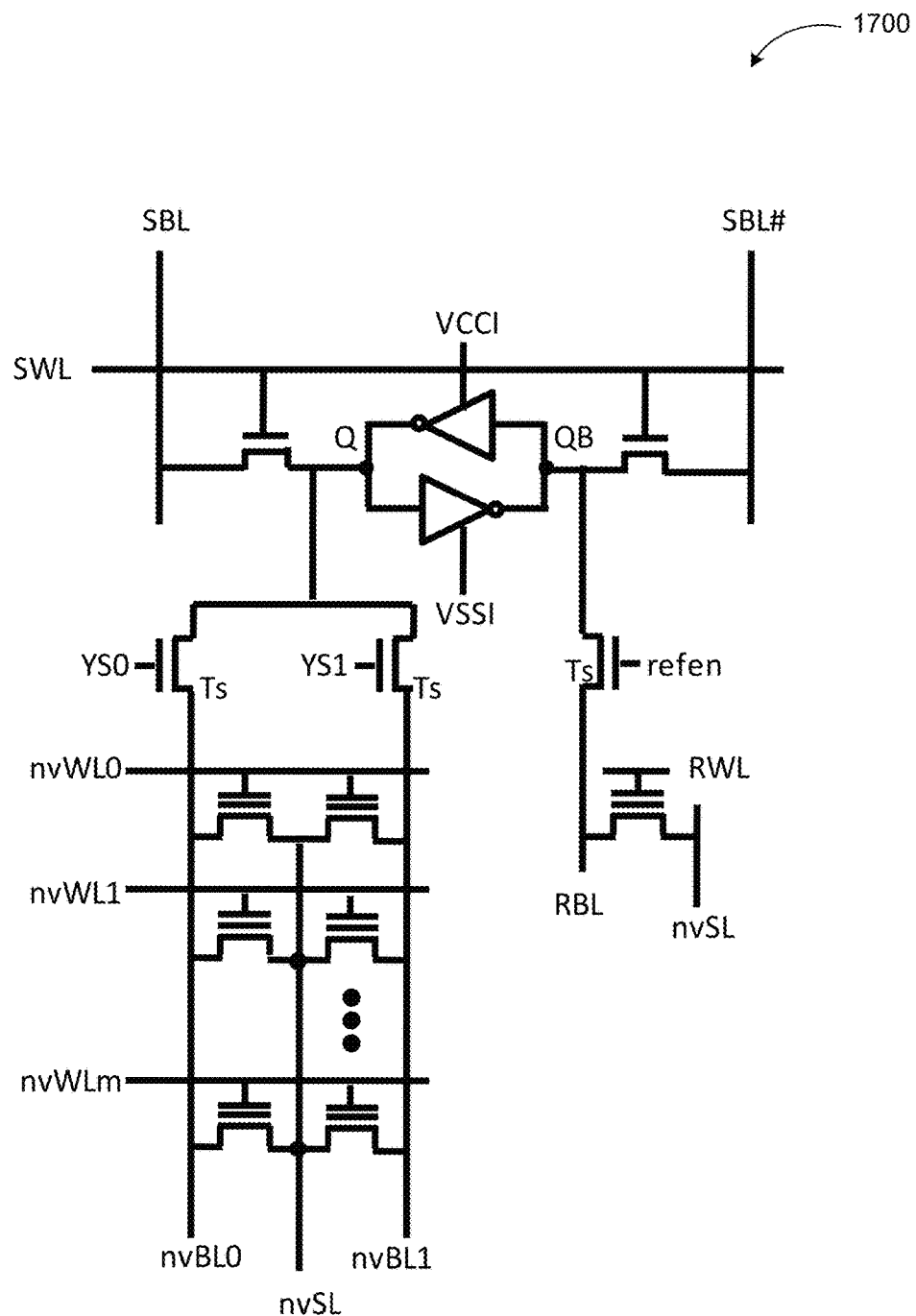
FIG. 17 is a schematic circuit diagram illustrating a single-cell structured nvSRAM cell with NVM cell connected by multiple rows and columns.

FIG. 17 is a schematic diagram illustrating a single-cell structured nvSRAM cell with NVM cell connected by multiple rows and columns, arranged in accordance with at least some embodiments described herein.

Diagram 1700 shows a single-cell structure for an nvSRAM cell with NVM cell connected by multiple rows and columns. Only 1 column may be selected for both recall and write, and YS0/YS1 may be the column decode signal. The number of columns may not be limited to two. In an Erase mode, Ts may be off, nvBL/nvSL may be floating, selected WL may be biased to a negative voltage (e.g., −10V). In some embodiments, the well of NVM cell may be biased to a positive high voltage while gate is maintained at a negative voltage.

In a Program mode, the Select gate may be biased to positive HV, nvSL may be floating. In some embodiments, nvSL may be biased at a positive voltage. nvBL of the program cell may be set to '0' while inhibited cell is floating. In a Recall mode, VCCI/VSSI may be turned off, Q/QB may be discharged to a ground level by turning on SWL and forcing SBL/SBL# at '0'. The pair of selected NVM cell and the reference cell, and Ts may be turned on and nvSL may be applied to VDD level. Then, there may be a voltage difference between Q and QB due to the different Vt states of the selected NVM cell and thy reference cell. VCCI may be ramped up and VSSI pulled down. Q and QB may be latched to a stable status according to the Vt status of the NVM cells. In some embodiments, RBL may include an additional capacitor circuit to match the nvBL loading.

Figure 18:
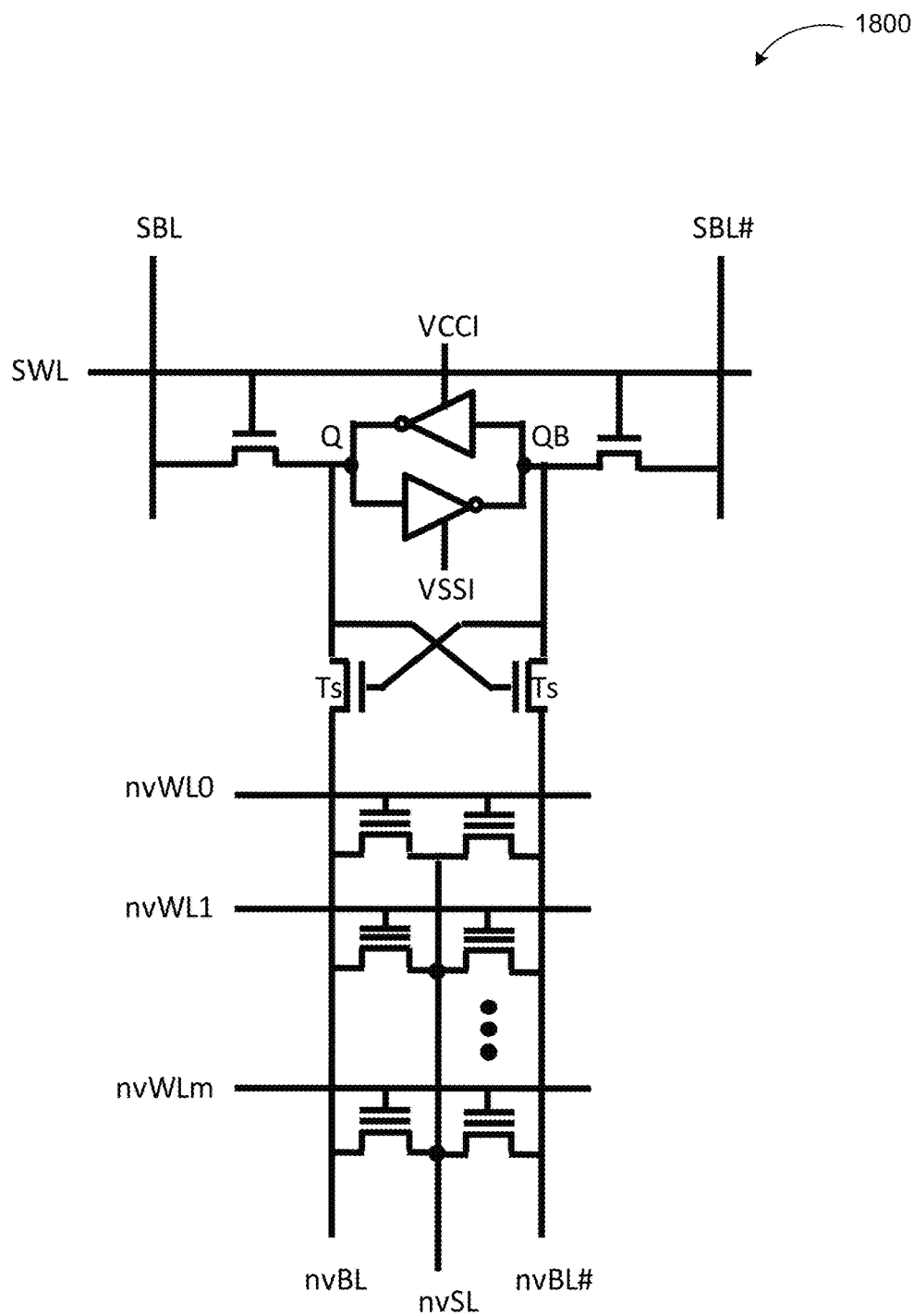
FIG. 18 is a schematic circuit diagram illustrating an nvSRAM cell with NVM cell connected by multiple rows.

FIG. 18 is a schematic diagram illustrating an nvSRAM cell with NVM cell connected by multiple rows, arranged in accordance with at least some embodiments described herein.

Diagram 1800 shows an example nvSRAM cell with NVM cell connected by multiple rows. In an Erase mode, VCCI/VSSI may be off and a negative voltage may be biased to NVM cell gate while S/D is at a floating state. In a Program mode, the Select gate may be biased to positive HV, nvSL may be floating. In some embodiments, nvSL may be biased at a positive voltage. nvBL of the program cell may be set to '0' while inhibited cell is floating. In a Recall mode, Q/QB may be discharged to '0'. VCCI may be ramped up while the NVM cell is turned on and the nvSL set to '0'. There may be a voltage difference between Q and QB due to the different Vt states of the NVM cells. VSSI may be connected to '0' in order to latch Q/QB to a stable state.

Figure 19:
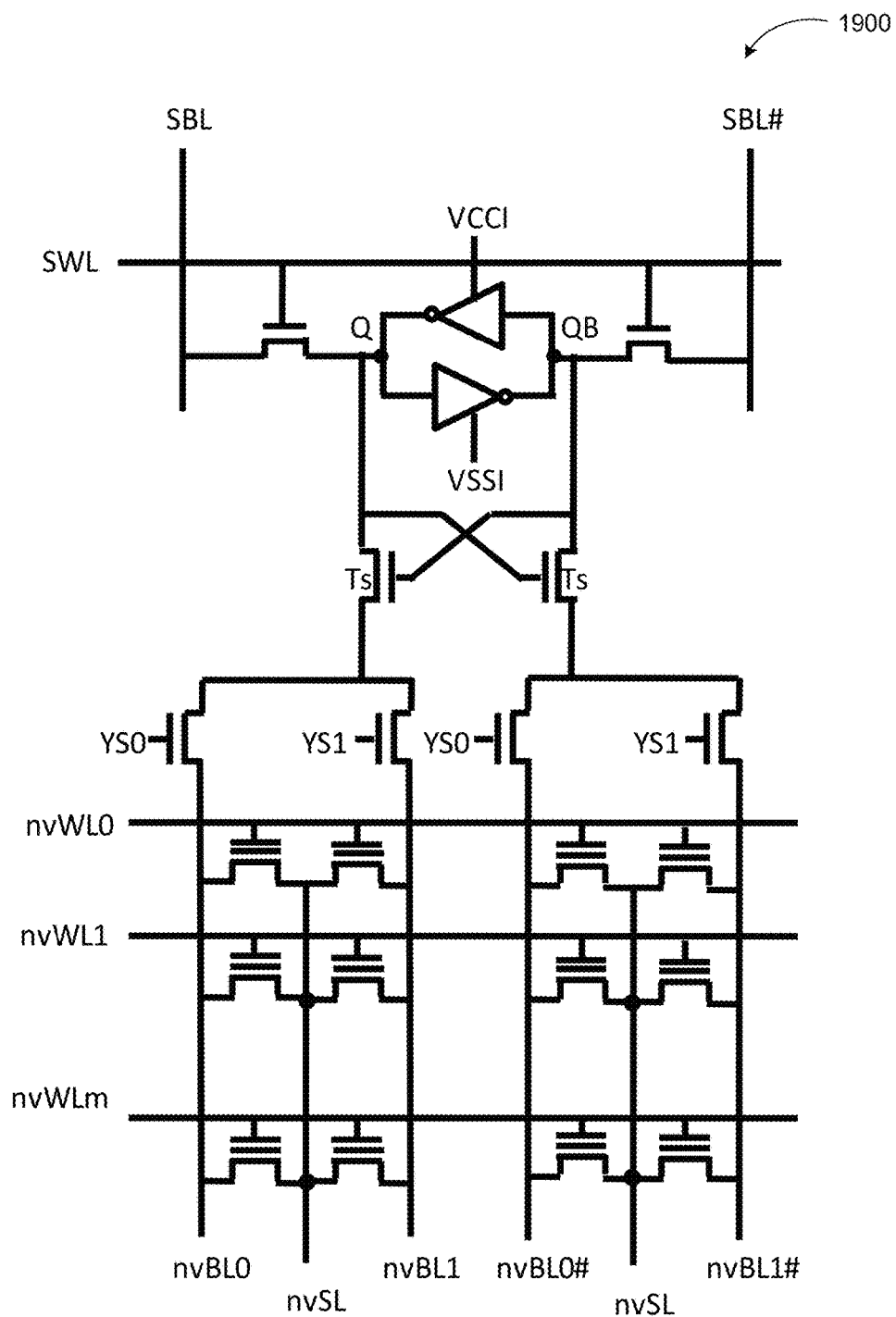
FIG. 19 is a schematic circuit diagram illustrating an nvSRAM cell with NVM cell connected by multiple rows and columns.

FIG. 19 is a schematic diagram illustrating an nvSRAM cell with NVM cell connected by multiple rows and columns, arranged in accordance with at least some embodiments described herein.

Diagram 1900 shows an example nvSRAM cell with NVM cell connected by multiple rows and columns. Only 1 column may be selected for both recall and write, and YS0/YS1 may be the column decode signal. The number of columns may not be limited to two. In an Erase mode, VCCI/VSSI may be off and a negative voltage may be biased to NVM cell gate while S/D is at a floating state. In a Program mode, the Select gate may be biased to positive HV, nvSL may be floating. In some embodiments, nvSL may be biased at a positive voltage. nvBL of the program cell may be set to '0' while inhibited cell is floating. In a Recall mode, Q/QB may be discharged to '0'. VCCI may be ramped up while the NVM cell is turned on and the nvSL set to '0'. There may be a voltage difference between Q and QB due to the different Vt states of the NVM cells. VSSI may be connected to '0' in order to latch Q/QB to a stable state.

As mentioned above, the memory structures illustrated in FIG. 14 through 19 may provide enhanced efficiency, speed, and reduced resource consumption in a wide variety of applications through the connection of the NVM cells to inner nodes of the SRAM of each memory structure instead of connections through bitlines. Implementation of the memory structures of FIG. 14 through 19 are not limited to FPGA applications, and may be used in any memory employing circuitry.

Some embodiments are directed to example processes to operate re-configurable non-volatile memory structures and systems for FPGAs. The operations of any process described herein are not necessarily presented in any particular order and that performance of some or all of the operations in an alternative order(s) is possible and is contemplated. The operations have been presented in the demonstrated order for ease of description and illustration. Operations may be added, combined, modified, omitted, and/or performed simultaneously, in a different order, etc., without departing from the scope of the present disclosure.

The illustrated process can be ended at any time and need not be performed in its entirety. Some or all operations of the processes, and/or substantially equivalent operations, can be performed by execution by one or more processors of computer-readable instructions included on a computer storage media, such as described herein, including a tangible non-transitory computer-readable storage medium. The term "computer-readable instructions," and variants thereof, as used in the description and claims, is used expansively herein to include routines, applications, application modules, program modules, programs, components, data structures, algorithms, or the like. Computer-readable instructions can be implemented on various system configurations, including single-processor or multiprocessor systems, minicomputers, mainframe computers, personal computers, hand-held computing devices, microprocessor-based, programmable consumer electronics, combinations thereof, or the like.

Figure 20:
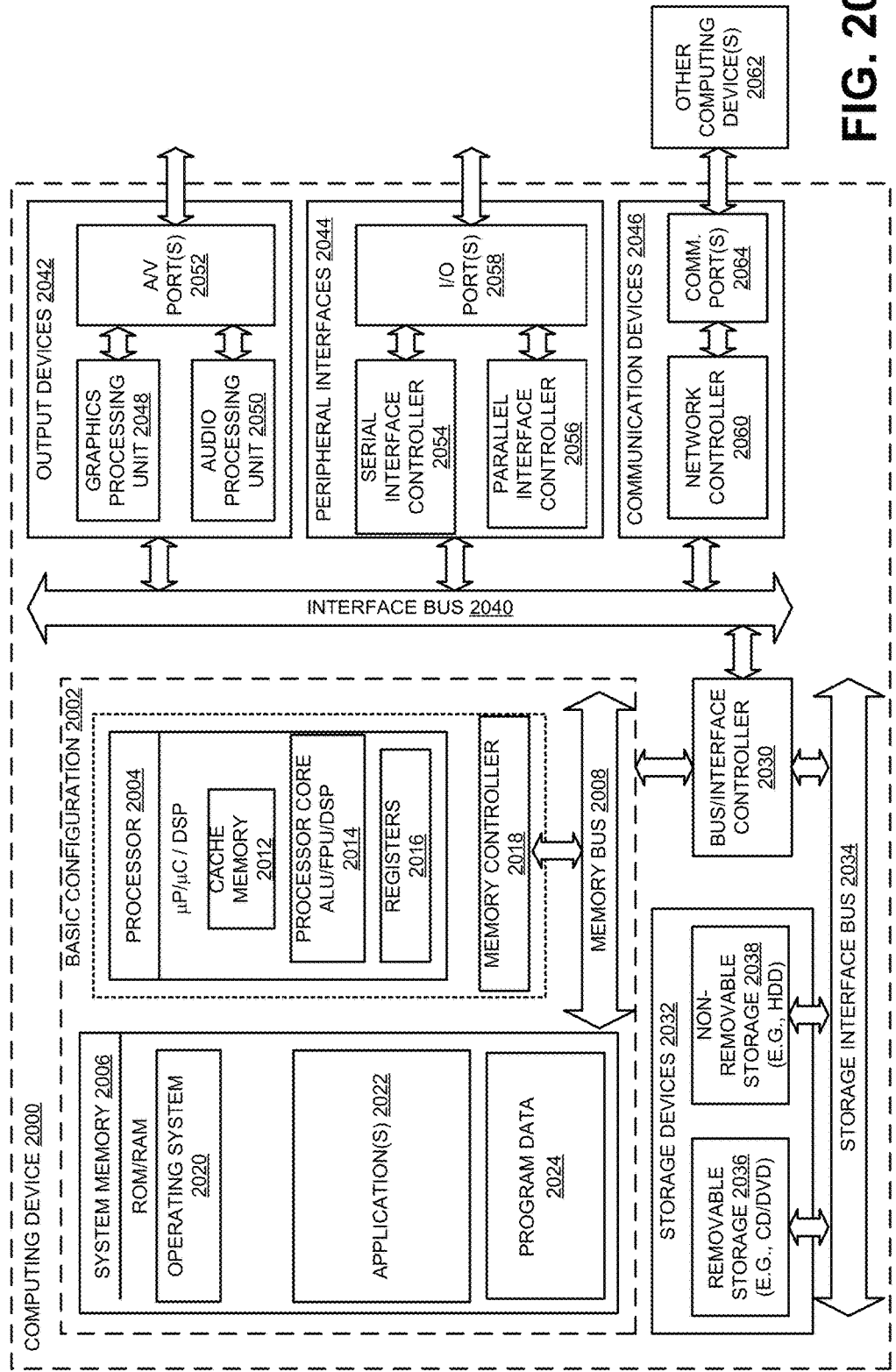
FIG. 20 is a block diagram illustrating an example computing device that is arranged for implementing re-configurable NVM structures in FPGAs as discussed herein.

FIG. 20 is a block diagram illustrating an example computing device 2000 that is arranged for implementing re-configurable NVM structures in FPGAs as discussed herein, in accordance with at least some embodiments described herein. In a very basic configuration 2002, computing device 2000 typically includes one or more processors 2004 and system memory 2006. A memory bus 2008 can be used for communicating between the processor 2004 and the system memory 2006.

Depending on the desired configuration, processor 2004 can be of any type including but not limited to a microprocessor (μP), a microcontroller (μC), a digital signal processor (DSP), or any combination thereof. Processor 2004 can include one more levels of caching, such as cache memory 2012, a processor core 2014, and registers 2016. The processor core 2014 can include an arithmetic logic unit (ALU), a floating point unit (FPU), a digital signal processing core (DSP core), or any combination thereof. A memory controller 2018 can also be used with the processor 2004, or in some implementations the memory controller 2020 can be an internal part of the processor 2004.

Depending on the desired configuration, the system memory 2006 can be of any type including but not limited to volatile memory (such as RAM), non-volatile memory (such as ROM, flash memory, etc.) or any combination thereof. System memory 2006 typically includes an operating system 2020, one or more applications 2022, and program data 2024.

Computing device 2000 can have additional features or functionality, and additional interfaces to facilitate communications between the basic configuration 2002 and any required devices and interfaces. For example, a bus/interface controller 2040 can be used to facilitate communications between the basic configuration 2002 and one or more data storage devices 2032 via a storage interface bus 2034. The data storage devices 2032 can be removable storage devices 2036, non-removable storage devices 2038, or a combination thereof. Examples of removable storage and non-removable storage devices include magnetic disk devices such as flexible disk drives and hard-disk drives (HDDs), optical disk drives such as compact disk (CD) drives or digital versatile disk (DVD) drives, solid state drives (SSDs), and tape drives to name a few. Example computer storage media can include volatile and nonvolatile, removable and non-removable media implemented in any method or technology fix storage of information, such as computer readable instructions, data structures, program modules, or other data.

System memory 2006, removable storage 2036 and non-removable storage 2038 are all examples of computer storage media. Computer storage media includes, but is not limited to, RAM, ROM, EEPROM, flash memory or other memory technology, CD-ROM, digital versatile disks (DVDs) or other optical storage, magnetic cassettes, magnetic tape, magnetic disk storage or other magnetic storage devices, or any other medium which can be used to store the desired information and which can be accessed by computing device 2000. Any such computer storage media can be part of device 2000. Thus, any of the computer storage media may be implemented using the SRAM based memory structures as discussed herein.

Computing device 2000 can also include an interface bus 2040 for facilitating communication from various interface devices (e.g., output interfaces, peripheral interfaces, and communication interfaces) to the basic configuration 2002 via the bus/interface controller 2030. Example output devices 2042 include a graphics processing unit 2048 and an audio processing unit 2050, which can be configured to communicate to various external devices such as a display or speakers via one or more A/V ports 2052. Example peripheral interfaces 2044 include a serial interface controller 2054 or a parallel interface controller 2056, which can be configured to communicate with external devices such as input devices (e.g., keyboard, mouse, pen, voice input device, touch input device, etc.) or other peripheral devices (e.g., printer, scanner, etc.) via one or more I/O ports 2058. An example communication device 2046 includes a network controller 2060, which can be arranged to facilitate communications with one or more other computing devices 2062 over a network communication via one or more communication ports 2064. The communication connection is one example of a communication media. Communication media may typically be embodied by computer readable instructions, data structures, program modules, or other data in a modulated data signal, such as a carrier wave or other transport mechanism, and includes any information delivery media. A "modulated data signal" can be a signal that has one or more of its characteristics set or changed in such a manner as to encode information in the signal. By way of example, communication media can include wired media such as a wired network or direct-wired connection, and wireless media such as acoustic, radio frequency (RF), infrared (IR) and other wireless media. The term computer readable media as used herein can include both storage media and communication media.

Computing device 2000 can be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 2000 can also be implemented as a personal computer including both laptop computer and non-laptop computer configurations.

The present disclosure is not to be limited in terms of the particular embodiments described in this application, which are intended as illustrations of various aspects. Many modifications and variations can be made without departing from its spirit and scope. Functionally equivalent methods and apparatuses within the scope of the disclosure, in addition to those enumerated herein, are possible. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, compounds, or compositions, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if as specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations.

However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include, but not be limited to, systems that have A alone, B alone, C alone, A and B together, A and C together, B and C together, and/or B, and C together, etc.). It will be further understood by those within the art that virtually any disjunctive ward and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

Further, the use of the terms "first," "second," "third," "fourth," and the like is to distinguish between repeated instances of a component or a step in a process and does not impose a serial or temporal limitations unless specifically stated to require such serial or temporal order.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," or the like include the number recited and refer to ranges which can be subsequently broken down into subranges as discussed above. Finally, as will be understood by one skilled in the art, a range includes each individual member. Thus, for example, a group having 1-3 elements refers to groups having 1, 2, or 3 elements. Similarly, a group having 1-5 elements refers to groups having 1, 2, 3, 4, or 5 elements, and so forth.

While various aspects and embodiments have been disclosed herein, other aspects and embodiments are possible. The various aspects and embodiments disclosed herein are for purposes of illustration and are not intended to be limiting, with the true scope and spirit being indicated by the following claims.

What is claimed is:

1. A re-configurable Field Programmable Gate Array (FPGA), the FPGA comprising:
   a plurality of programmable gate array circuits;
   a look-up table (LUT) circuit comprising a plurality of configure units, a function selector circuit, and a decoding circuit, wherein the plurality of configure units comprise Flash cells and static random access memory (SRAM) cells and are configured to store a plurality of truth tables; and
   a control logic circuit configured to provide a function address mapping to the function selector circuit for re-configuration of the LUT.

2. The FPGA of claim 1, wherein the LUT comprises M configure units, each configure unit capable of storing N bits such that the LUT is configured to store a maximum of M truth tables, M and N being positive integers.

3. The FPGA of claim 2, wherein the LUT is configured to receive the maximum of M truth tables simultaneously at load time.

4. The FPGA of claim 1, wherein each configure unit comprises a plurality of non-volatile memory (NVM) cells.

5. The FPGA of claim 1, further comprising a plurality of multi-bit memory structures configured to perform routing for loading of the truth table such that memory control routing is reloaded from FPGA internal memory.

6. The FPGA of claim 1, wherein each configure unit is configured to store multi-context data that includes one or more of a different logic for multiple FPGA functions or a different branch of an FPGA function.

7. The FPGA of claim 1, further comprising an internal register and an NVM internal memory to store a function-address mapping table.

8. The FPGA of claim 7, wherein the function-address mapping table is loaded to the internal register from the NVM internal memory upon power up of the FPGA and provided to the function selector circuit by the internal register.

9. The FPGA of claim 1, wherein the function selector circuit is a common block of the FPGA for use with a plurality of LUTs.

10. The FPGA of claim 1, further comprising a sense amplifier configured to read data from the plurality of configure units to configure the LUT.

11. The FPGA of claim 1, further comprising a switch control circuit to detect a context select transition and to configure the LUT.

12. The FPGA of claim 1, further comprising a cell controller circuit, wherein the function selector is configured to select corresponding NVM cells in a configure unit and the cell controller is configured to control read and write operations on the selected NVM cells.

13. The FPGA of claim 1, further comprising a plurality of re-configurable connection and switch blocks.

14. The FPGA of claim 13, wherein the plurality of re-configurable connection and switch blocks are programmable interconnect points and comprise one of a cross-point structure, a compound structure, or a break point structure.

15. The FPGA of claim 1, wherein one of:
   the FPGA is completely re-configurable, and the LUT and the control logic circuit are configured to enable switching of a programmed function to one or more new functions; or
   the FPGA is partially re-configurable, and the LUT and the control logic circuit are configured to enable switching of a programmed function to one or more new functions while not modifying another programmed function.

16. A re-configurable Field Programmable Gate Array (FPGA), the FPGA comprising:

a plurality of programmable gate array circuits;
a routing circuit comprising a plurality of configure units, a routing selector circuit, and a decoding circuit, wherein the plurality of configure units comprise Flash cells and static random access memory (SRAM) cells and are configured to store a plurality of truth tables; and
a control logic circuit configured to provide a routing address mapping to the routing selector circuit for connecting and routing signals.

17. The FPGA of claim 16, wherein the routing circuit comprises M configure units, each configure unit capable of storing N bits such that the routing circuit is configured to store a maximum of M truth tables, M and N being positive integers.

18. A configure unit for a re-configurable memory devices, the configure unit comprising:
a plurality of non-volatile memory (NVM) cells configured to store a truth table for a look-up table (LUT) of a field programmable gate array (FPGA), wherein the LUT comprises a plurality of configure units comprising Flash cells and static random access memory (SRAM) cells and is re-configurable based on a function address mapping provided by a control logic circuit of the FPGA to a function selector circuit of the LUT; and
a multi-context non-volatile static random access memory (nvSRAM) device.

19. The configure unit of claim 18, wherein at least one of the NVM cells includes a SONOS split gate cell, a floating gate cell, an eFlash cell, a pFlash cell, a 1T/1R resistive RAM, a resistive memory based cell, a phase change memory based cell, a ferroelectric RAM based cell, or a magnetic RAM based cell.

20. The configure unit of claim 18, further comprising at least one isolation device configured to couple the plurality of NVM cells and the nvSRAM device and configured to enable one of a read or a write operation based on a received enable signal.

21. The configure unit of claim 18, wherein the configure unit is configured in a differential cell structure and the nvSRAM device is coupled to multiple rows and one or more columns of NVM cells.

22. The configure unit of claim 18, wherein the configure unit is configured in a single cell structure and the nvSRAM device is coupled to multiple rows and one or more columns of NVM cells.

23. A multi-bit memory structure for a configure unit for re-configurable memory devices, the configure unit comprising:
a static random access memory (SRAM) cell; and
two or more of non-volatile memory (NVM) cells coupled to the SRAM cell, wherein the two or more NVM cells are connected to a pair of inner nodes of the SRAM cell, the pair of inner nodes being part of passing transistors of the SRAM cell.

24. The multi-bit memory structure of claim 23, wherein data stored in the SRAM cell is transferred to or transferred from one of the two or more NVM cells connected to the SRAM cell.

25. The multi-bit memory structure of claim 23, wherein at least one of the two or more NVM cells includes a SONOS split gate cell, a floating gate cell, an eFlash cell, a pFlash cell, a 1T/1R resistive RAM, a resistive memory based cell, a phase change memory based cell, a ferroelectric RAM based cell, or a magnetic RAM based cell.

26. The multi-bit memory structure of claim 23, further comprising:
a row of SRAM cells that include the SRAM cell; and
one or more rows of NVM cells, wherein the one or more rows of NVM cells are connected to a pair of inner nodes of corresponding SRAM cells in the row of SRAM cells, the pair of inner nodes being part of passing transistors of the SRAM cells in the row of SRAM cells.

* * * * *